(12) United States Patent
Kitamura et al.

(10) Patent No.: US 7,947,826 B2
(45) Date of Patent: May 24, 2011

(54) PHTHALOCYANINE COMPOUND BASED-ORGANIC SEMICONDUCTOR

(75) Inventors: Tetsu Kitamura, Ashigarakami-gun (JP); Takanori Hioki, Minami-ashigara (JP); Toshiyuki Saiki, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 587 days.

(21) Appl. No.: 11/725,449

(22) Filed: Mar. 20, 2007

(65) Prior Publication Data

US 2008/0142790 A1    Jun. 19, 2008

(30) Foreign Application Priority Data

Mar. 20, 2006    (JP) ................................. 2006-077768
Feb. 20, 2007    (JP) ................................. 2007-039295

(51) Int. Cl.
*C07D 487/22*    (2006.01)
*C07B 47/00*    (2006.01)
(52) U.S. Cl. ...................................................... 540/145
(58) Field of Classification Search .................. 540/145
See application file for complete search history.

(56) References Cited

U.S. PATENT DOCUMENTS 5,498,502 A * 3/1996 Muramoto et al. .......... 430/49.1
5,847,111 A * 12/1998 Wald et al. .................... 540/125

OTHER PUBLICATIONS

Sharman et al., "Synthesis and Photddynamic . . . ", Bioconjugate Chem. 2005, 16, 1166-1175.*
Christopher R. Newman, et al.; "Introduction to Organic Thin Film Transistors and Design of n-Channel Organic Semiconductors"; Chem. Mater. 2004, vol. 16, No. 23; pp. 4436-4451.
René A.J. Janssen, et al.; "Polymer-Fullerene Bulk Heterojunction Solar Cells"; MRS Bulletin; vol. 30; Jan. 2005; pp. 33-36.
Advanced Surface Technology Exhibition & Conference ASTEC2007; Feb. 21-23, 2007.

* cited by examiner

*Primary Examiner* — Paul V. Ward
(74) *Attorney, Agent, or Firm* — Sughrue Mion, PLLC

(57) ABSTRACT

An organic semiconductor having at least one compound of formula (PC-1); and a compound represented by formula (PC-1a):

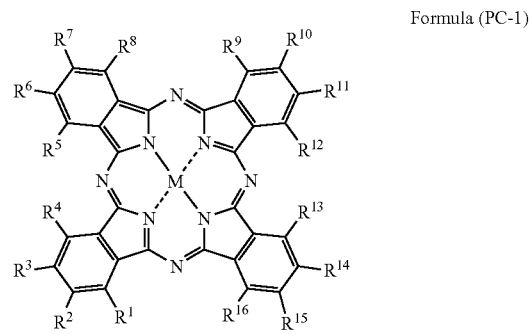

Formula (PC-1)

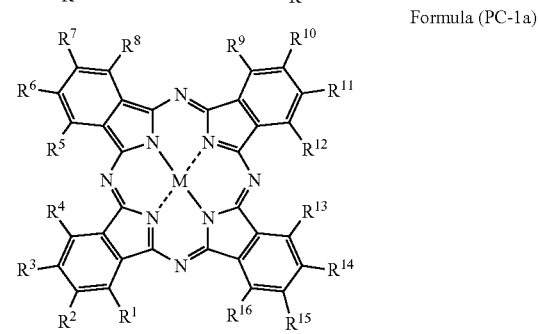

Formula (PC-1a)

wherein M is a metallic atom, or two hydrogen atoms which bond respectively to a nitrogen atom of an isoindole ring and to a nitrogen atom of an isoindoline ring; $R^1$ to $R^{16}$ each independently are a hydrogen atom or a substituent, in which at least two substituents of $R^1$ to $R^{16}$ in formula (PC-1) are two or more different substituents, and in which at least one of the substituents of $R^1$ to $R^{16}$ in formula (PC-1a) is a fluorine atom, and at least one of the substituents of $R^1$ to $R^{16}$ in formula (PC-1a) is an electron-attracting group other than a fluorine atom.

4 Claims, 17 Drawing Sheets

PHTHALOCYANINE COMPOUND BASED-ORGANIC SEMICONDUCTOR

FIELD OF THE INVENTION

The present invention relates to a phthalocyanine compound having a particular structure; an organic semiconductor and a method of producing the same, an electronic device, an organic photoelectric conversion device, an organic field-effect transistor, and an organic electroluminescence device, using the compound.

BACKGROUND OF THE INVENTION

With the arrival of a ubiquitous information society, a terminal is demanded to transfer information anytime, anywhere. For such a terminal, flexible, light-weight, and inexpensive electronic devices are required, but the previous devices using inorganic materials such as silicon does not sufficiently meet the requirement. Accordingly, in recent years, electronic devices using organic materials as semiconductors or the like are intensively studied for satisfying such requirements. As a p-type organic semiconductor, there are known materials such as pentacene capable of forming a thin film through a dry process and P3HT (poly(3-hexylthiophene)) capable of forming a thin film through a wet process.

Beside, as n-type organic semiconductors, there are known materials such as fullerene capable of forming a thin film through a dry process and PCBM ([6,6]-phenyl-C61-methyl butyrate) capable of forming in a thin film through a wet process. However, these materials are not satisfactory from the viewpoint of stability in atmosphere, because it is necessary to seal them in order to prevent them from deterioration in atmosphere when they work as electronic devices. Further, there is known hexadecafluoro copper phthalocyanine ($F_{16}$ Cu Pc) that has characteristics of reduced deterioration in atmosphere. However, there is a problem that because of low solubility to solvent, this compound is not suitable for forming a thin film through a wet process ("Yuki Toranjista no Dosasei Kojogijutsu [Zairyo Kaihatsu Sakuseiho Sosi Sekkei] (Technology of improving operation properties of Organic transistors [Development of materials, Production methods, Design of elements]" under supervision of Kazuhiro kudo, Gijutsu Johokyokai (2003) p 48 to 49, and Chemistry of Materials 16, 4436 to 4451 (2004)).

In view of the above, it is required to develop n-type organic semiconductor materials that have characteristics of reduced deterioration in atmosphere and that are suitable for forming a thin film according to a wet process (e.g., a liquid coating process).

Organic semiconductors are useful as photoelectric conversion materials for producing organic photoelectric conversion devices such as organic thin film solar cells. These devices are easier to be manufactured than those of an inorganic semiconductor such as silicon and the like. In particular, organic semiconductors capable of forming a film through a wet process have potential to realize devices having a large area, at low temperature, and at low cost. So far, for example, an organic thin film solar cell using a mixed film of P3HT and PCBM as a photoelectric conversion layer is reported, but its photoelectric conversion performance is inferior to that of silicon devices. Consequently, further improvements in the performance are required. One of the reasons for a low energy conversion efficiency of an organic thin film solar cell is a narrow wavelength region in which materials of the cell can absorb and photo-electrically convert, taking the wavelength range of the sun light into consideration. In particular, the organic thin film solar cell can not effectively utilize a light in a long wavelength region ("Yukihakumaku Taiyodenchi no Saishingijutsu (Latest Technology for Organic Thin Film Solar Cell)", supervised by Kaku Uehara, Susumu Yoshikawa, CMC Inc. (2005) pp. 1-8, and MRS Bulletin, 30, 33-36 (2005)).

Accordingly, it is required to develop organic semiconductor materials which are suitable for film formation through a wet film forming process (e.g., a liquid coating process), and exhibit light absorption and photoelectric conversion properties even in a long wavelength region.

SUMMARY OF THE INVENTION

The present invention resides in an organic semiconductor having at least one compound represented by formula (PC-1):

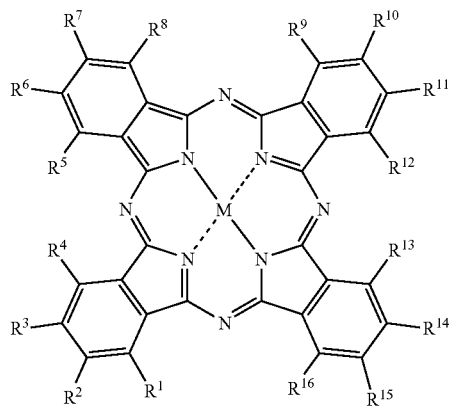

Formula (PC-1)

wherein, M represents a metallic atom or two hydrogen atoms, the hydrogen atoms bond respectively to a nitrogen atom of an isoindole ring and to a nitrogen atom of an isoindoline ring when M represents two hydrogen atoms; $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, and $R^{16}$ each independently represents a hydrogen atom or a substituent with the proviso that at least the two substituents are two or more different substituents.

Further, the present invention resides in:
a compound represented by formula (PC-1a):

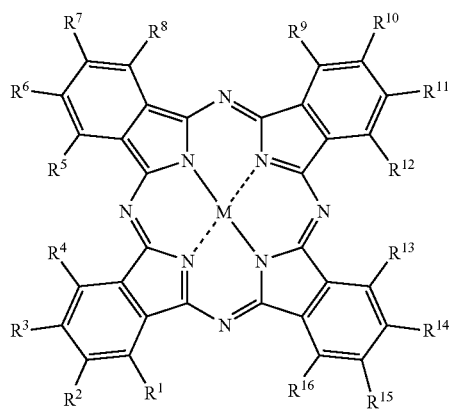

Formula (PC-1a)

wherein, M represents a metallic atom or two hydrogen atoms, the two hydrogen atoms bond respectively to a nitrogen atom of an isoindole ring and to a nitrogen atom of an isoindoline ring when M represents two hydrogen atoms; $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, and $R^{16}$ each independently represents a hydrogen atom or a substituent with the proviso that at least one of the substituents is a fluorine atom, and at least one of the substituents is an electron-attracting group other than a fluorine atom;

a compound represented by formula (PC-2):

Formula (PC-2)

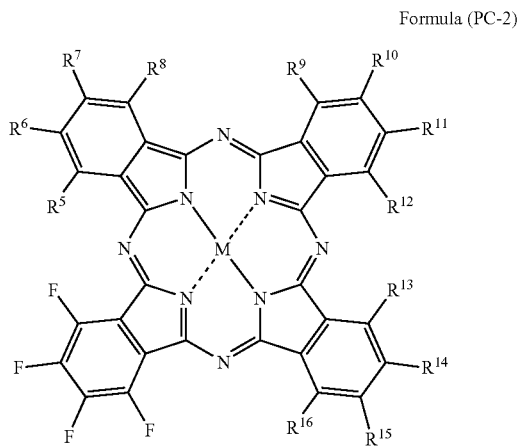

wherein M represents a metallic atom or two hydrogen atoms, the two hydrogen atoms bond respectively to a nitrogen atom of an isoindole ring and to a nitrogen atom of an isoindoline ring when M represents two hydrogen atoms; $R^5$, $R^6$, $R^7$, $R^8$, $R^9$, $R^{10}$, $R^{11}$, $R^{12}$, $R^{13}$, $R^{14}$, $R^{15}$, and $R^{16}$ each independently represents a hydrogen atom or a substituent with the proviso that at least the one substituent is —$SO_2R^{17}$ or —$SO_2N(R^{17})_2$, and $R^{17}$ represents a hydrogen atom, an alkyl group, an aryl group, or a heterocyclic group; and a compound represented by formula (PC-3):

Formula (PC-3)

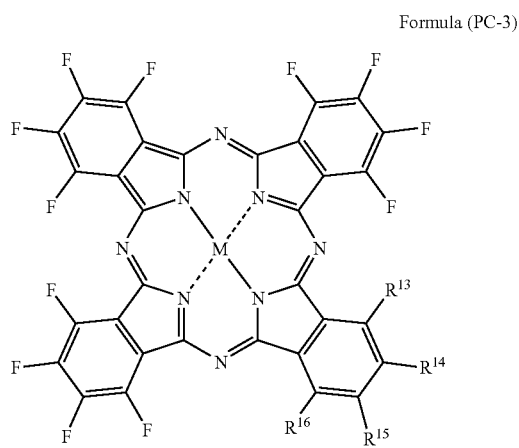

wherein, M represents a metallic atom or two hydrogen atoms, the two hydrogen atoms bond respectively to a nitrogen atom of an isoindole ring and to a nitrogen atom of an isoindoline ring when M represents two hydrogen atoms; $R^{13}$, $R^{14}$, $R^{15}$, and $R^{16}$ each independently represents a hydrogen atom or a substituent with the proviso that at least the one substituent is —$SO_2R^{17}$ or —$SO_2N(R^{17})_2$, and $R^{17}$ represents a hydrogen atom, an alkyl group, an aryl group, or a heterocyclic group.

Still further, the present invention resides in: a thin film organic semiconductor having the above-described compounds; and an electronic device, an organic photoelectric conversion device, an organic field-effect transistor, and an organic electroluminescence device, having the above-described organic semiconductor.

Moreover, the present invention resides in a method of producing a thin film of an organic semiconductor having, coating a liquid containing the above-described compounds.

Other and further features and advantages of the present invention will appear more fully from the following description, appropriately referring to the accompanying drawings.

BRIEF DESCRIPTION OF THE DRAWINGS

FIG. 8 (A) shows drain voltage/drain current characteristics; and FIG. 8 (B) shows gate voltage/drain current characteristics (drain voltage=+30 V).

FIG. 10 (A) shows an image of one embodiment of a field-effect transistor device of the present invention, and FIG. 10 (B) shows an image of a thin film of a comparison sample ($F_{16}C_uP_c$).

DETAILED DESCRIPTION OF THE INVENTION

Figure 1:
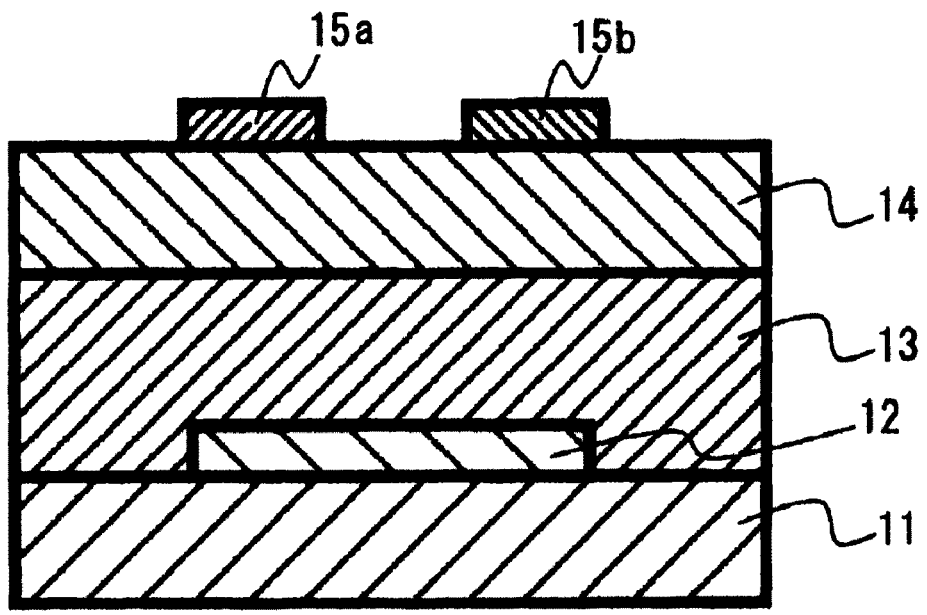
FIG. 1 is a sectional view of schematically illustrating one embodiment of an organic field-effect transistor of the present invention.

According to the present invention, there is provided the following means.

(1) An organic semiconductor having at least one compound represented by formula (PC-1):

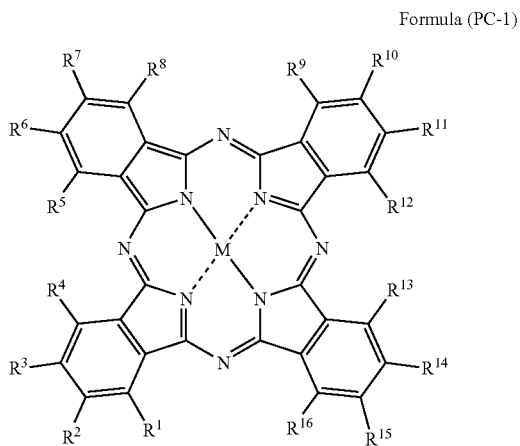

Formula (PC-1)

wherein, M represents a metallic atom or two hydrogen atoms, the two hydrogen atoms bond respectively to a nitrogen atom of an isoindole ring and to a nitrogen atom of an isoindoline ring when M represents two hydrogen atoms; $R^1$, $R^2$, $R^3$, $R^4$, $R^5$, $R^6$, $R^7$, $R^8 R^9$, $R^{10}$, $R^{11}$, $R^{12}$, $R^{13}$, $R^{14}$, $R^{15}$, and $R^{16}$ each independently represents a hydrogen atom or a substituent with the proviso that at least the two substituents are two or more different substituents.

(2) The organic semiconductor according to (1), wherein at least one of the substituents of $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, and $R^{16}$ is a fluorine atom, and at least one of the substituents of $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, and $R^{16}$ is an electron-attracting group other than a fluorine atom.

(3) The organic semiconductor according to (1), wherein the compound represented by formula (PC-1) is a compound represented by formula (PC-2):

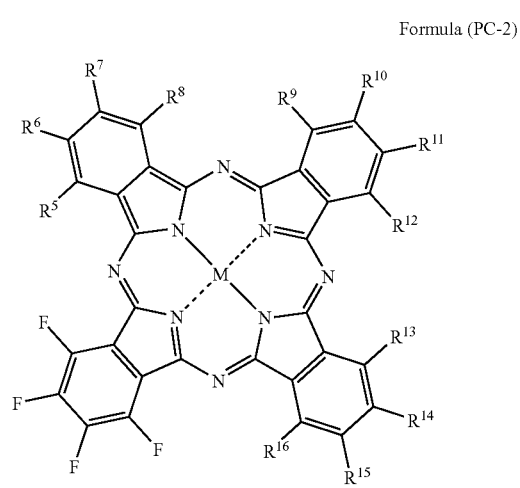

Formula (PC-2)

wherein M represents a metallic atom or two hydrogen atoms, the two hydrogen atoms bond respectively to a nitrogen atom of an isoindole ring and to a nitrogen atom of an isoindoline ring when M represents two hydrogen atoms; $R^5$, $R^6$, $R^7$, $R^8$, $R^9$, $R^{10}$, $R^{11}$, $R^{12}$, $R^{13}$, $R^{14}$, $R^{15}$, and $R^{16}$ each independently represents a hydrogen atom or a substituent with the proviso that at least the one substituent is —$SO_2R^{17}$ or —$SO_2N(R^{17})_2$, and $R^{17}$ represents a hydrogen atom, an alkyl group, an aryl group, or a heterocyclic group.

(4) The organic semiconductor according to (1), wherein the compound represented by formula (PC-1) is a compound represented by formula (PC-3):

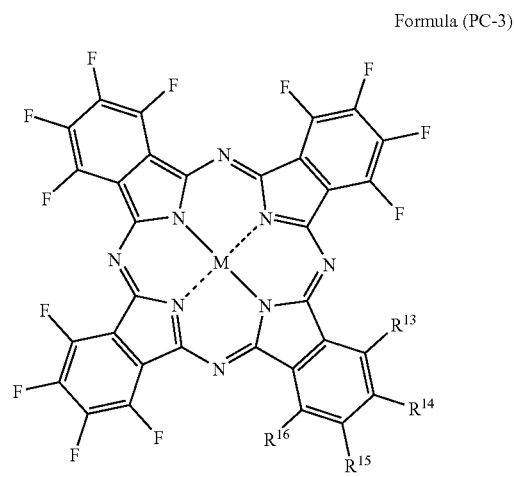

Formula (PC-3)

wherein, M represents a metallic atom or two hydrogen atoms, the two hydrogen atoms bond respectively to a nitrogen atom of an isoindole ring and to a nitrogen atom of an isoindoline ring when M represents two hydrogen atoms; $R^{13}$, $R^{14}$, $R^{15}$, and $R^{16}$ each independently represents a hydrogen atom or a substituent with the proviso that at least the one substituent is —$SO_2R^{17}$ or —$SO_2N(R^{17})_2$, and $R^{17}$ represents a hydrogen atom, an alkyl group, an aryl group, or a heterocyclic group.

(5) A compound represented by formula (PC-1a):

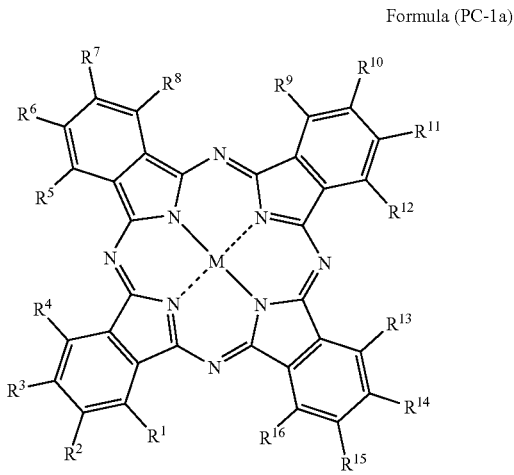

Formula (PC-1a)

wherein, M represents a metallic atom or two hydrogen atoms, the two hydrogen atoms bond respectively to a nitrogen atom of an isoindole ring and to a nitrogen atom of an isoindoline ring when M represents two hydrogen atoms; $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, and $R^{16}$ each independently represents a hydrogen atom or a substituent with the proviso that at least one of the substituents is a fluorine atom, and at least one of the substituents is an electron-attracting group other than a fluorine atom.

(6) A compound represented by formula (PC-2):

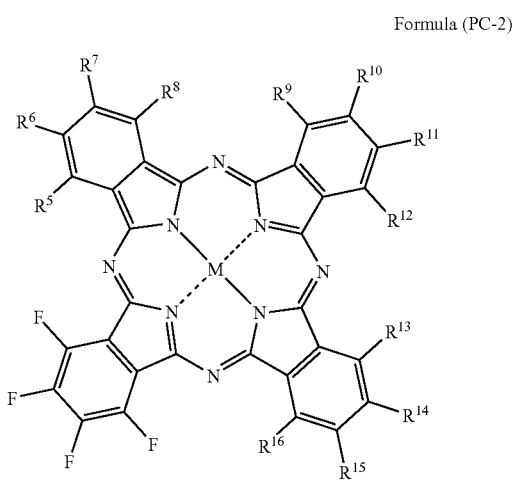

Formula (PC-2)

wherein M represents a metallic atom or two hydrogen atoms, the two hydrogen atoms bond respectively to a nitrogen atom of an isoindole ring and to a nitrogen atom of an isoindoline ring when M represents two hydrogen atoms; $R^5$, $R^6$, $R^7$, $R^8$, $R^9$, $R^{10}$, $R^{11}$, $R^{12}$, $R^{13}$, $R^{14}$, $R^{15}$, and $R^{16}$ each independently represents a hydrogen atom or a substituent with the proviso that at least the one substituent is $-SO_2R^{17}$ or $-SO_2N(R^{17})_2$, and $R^{17}$ represents a hydrogen atom, an alkyl group, an aryl group, or a heterocyclic group.

(7) A compound represented by formula (PC-3):

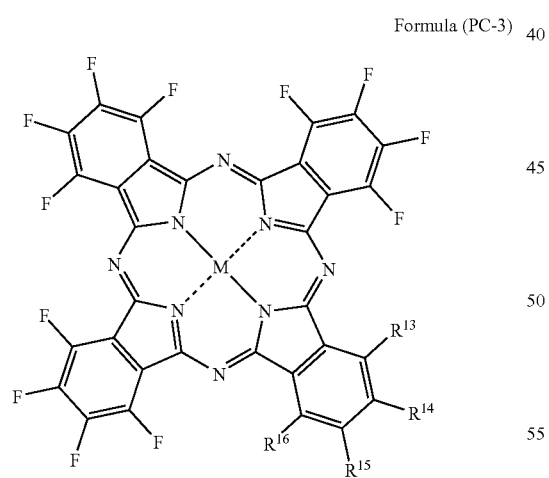

Formula (PC-3)

wherein, M represents a metallic atom or two hydrogen atoms, the two hydrogen atoms bond respectively to a nitrogen atom of an isoindole ring and to a nitrogen atom of an isoindoline ring when M represents two hydrogen atoms; $R^{13}$, $R^{14}$, $R^{15}$, and $R^{16}$ each independently represents a hydrogen atom or a substituent with the proviso that at least the one substituent is $-SO_2R^{17}$ or $-SO_2N(R^{17})_2$, and $R^{17}$ represents a hydrogen atom, an alkyl group, an aryl group, or a heterocyclic group.

(8) A thin film organic semiconductor having the compound represented by formulas (PC-1a) of (5).
(9) A thin film organic semiconductor having the compound represented by formulas (PC-2) of (6).
(10) A thin film organic semiconductor having the compound represented by formulas (PC-3) of (7).
(11) An electronic device having the organic semiconductor of (1).
(12) An electronic device having the organic semiconductor of (5).
(13) An organic photoelectric conversion device having the organic semiconductor of (1).
(14) An organic photoelectric conversion device having the organic semiconductor of (5).
(15) An organic field-effect transistor having the organic semiconductor of (1).
(16) An organic field-effect transistor having the organic semiconductor of (5).
(17) An organic electroluminescence device having the organic semiconductor of (1).
(18) An organic electroluminescence device having the organic semiconductor of (5).
(19) A method of producing a thin film of an organic semiconductor having the steps of, coating a liquid containing the compound represented by (PC-1a) of (5).

In the present invention, the term "thin film" means a film having a thickness of from several nm to several mm, preferably from several 10 nm to several 10 μm.

The present invention is explained in detail below.

A phthalocyanine compound represented by formula (PC-1) is explained.

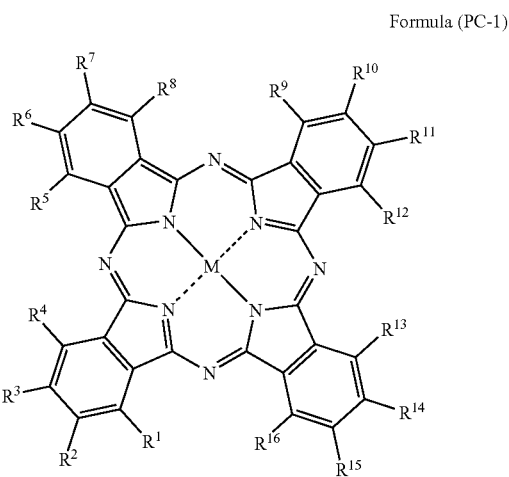

Formula (PC-1)

In the present invention, also in the formulas (PC-1), (PC-1a), (PC-2), and (PC-3) when specific sites represented by $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, and $R^{16}$ (hereinafter a series of the substituents is also referred to in the manner of "$R^1$ to $R^{16}$") are called "groups", the sites itself may not be substituted or may be substituted by one or more (to a possible maximum number) substituents. For example, "an alkyl group" means a substituted or unsubstituted alkyl group. Namely, the substituents which can be used in the compound for use in the present invention can be further substituted.

When the substituent represented by $R^1$ to $R^{16}$ is set "W", the substituent represented by W may be any substituent and is not particularly limited, and, examples thereof include a halogen atom, an alkyl group (including a cycloalkyl group, a bicycloalkyl group, and a tricycloalkyl group,), an alkenyl group (including a cycloalkenyl group and a bicycloalkenyl group), an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group (—B(OH)$_2$), a phosphate group (—OPO(OH)$_2$), a sulfate group (—OSO$_3$H), and other known substituents.

Specifically, the substituent represented by W represents the group as shown in the following items (1) to (48).

(1) Halogen atom (e.g., a fluorine atom, a chlorine atom, a bromine atom, an iodine atom)

(2) Alkyl group (which means a linear, branched or cyclic substituted or unsubstituted alkyl group, and examples of the alkyl group include the groups as shown in the following items (2-a) to (2-e))

(2-a) Alkyl group (alkyl group having preferably from 1 to 30 carbon atoms, e.g., methyl, ethyl, n-propyl, isopropyl, tert-butyl, n-octyl, eicosyl, 2-chloroethyl, 2-cyanoethyl, 2-ethylhexyl)

(2-b) Cycloalkyl group (preferably a substituted or unsubstituted cycloalkyl group having from 3 to 30 carbon atoms, e.g., cyclohexyl, cyclopentyl, 4-n-dodecyl-cyclohexyl)

(2-c) Bicycloalkyl group (preferably a substituted or unsubstituted bicycloalkyl group having from 5 to 30 carbon atoms, e.g., bicyclo[1,2,2]heptan-2-yl, bicyclo[2,2,2]octan-3-yl)

(2-d) Tricycloalkyl group (preferably a substituted or unsubstituted tricycloalkyl group having from 7 to 30 carbon atoms, e.g., 1-adamantyl)

(2-e) Alkyl group having a polycyclic structure

The alkyl group in the substituents described below (for example, an alkyl group in an alkylthio group) means an alkyl group having such a concept and further includes an alkenyl group and an alkynyl group.

(3) Alkenyl group (which means a linear, branched or cyclic substituted or unsubstituted alkenyl group, and examples of the alkenyl group include the groups as shown in the following items (3-a) to (3-c))

(3-a) Alkenyl group (preferably a substituted or unsubstituted alkenyl group having from 2 to 30 carbon atoms, e.g., vinyl, allyl, prenyl, geranyl, oreyl)

(3-b) Cycloalkenyl group (preferably a substituted or unsubstituted cycloalkenyl group having from 3 to 30 carbon atoms, e.g., 2-cyclopenten-1-yl, 2-cyclohexen-1-yl)

(3-c) Bicycloalkenyl group (a substituted or unsubstituted bicycloalkenyl group, preferably a substituted or unsubstituted bicycloalkenyl group having from 5 to 30 carbon atoms, e.g., bicyclo[2,2,1]hept-2-en-1-yl, bicyclo[2,2,2]oct-2-en-4-yl)

(4) Alkynyl group (preferably a substituted or unsubstituted alkynyl group having from 2 to 30 carbon atoms, e.g., ethynyl, propargyl, trimethylsilylethynyl)

(5) Aryl group (preferably a substituted or unsubstituted aryl group having from 6 to 30 carbon atoms, e.g., phenyl, p-tolyl, naphthyl, m-chlorophenyl, o-hexadecanoylaminophenyl, ferrocenyl)

(6) Heterocyclic group (preferably a monovalent group resultant from removing one hydrogen atom of a 5- or 6-membered substituted or unsubstituted aromatic or non-aromatic heterocyclic compound, more preferably a 5- or 6-membered aromatic heterocyclic group having from 3 to 30 carbon atoms, e.g., 2-furyl, 2-thienyl, 2-pyrimidinyl, 2-benzothiazolyl; the heterocyclic group may also be a cationic heterocyclic group such as 1-methyl-2-pyridinio and 1-methyl-2-quinolinio)

(7) Cyano group (8) Hydroxyl group (9) Nitro group

(10) Carboxyl group

(11) Alkoxy group (preferably a substituted or unsubstituted alkoxy group having from 1 to 30 carbon atoms, e.g., methoxy, ethoxy, isopropoxy, tert-butoxy, n-octyloxy, 2-methoxyethoxy)

(12) Aryloxy group (preferably a substituted or unsubstituted aryloxy group having from 6 to 30 carbon atoms, e.g., phenoxy, 2-methylphenoxy, 4-tert-butylphenoxy, 3-nitrophenoxy, 2-tradecanoylaminophenoxy)

(13) Silyloxy group (preferably a silyloxy group having from 3 to 20 carbon atoms, e.g., trimethylsilyloxy, tert-butyldimethylsilyloxy)

(14) Heterocyclic oxy group (preferably a substituted or unsubstituted heterocyclic oxy group having from 2 to 30 carbon atoms, e.g., 1-phenyltetrazol-5-oxy, 2-tetrahydropyranyloxy)

(15) Acyloxy group (preferably a formyloxy group, a substituted or unsubstituted alkylcarbonyloxy group having from 2 to 30 carbon atoms or a substituted or unsubstituted arylcarbonyloxy group having from 6 to 30 carbon atoms, e.g., formyloxy, acetyloxy, pivaloyloxy, stearoyloxy, benzoyloxy, p-methoxyphenylcarbonyloxy)

(16) Carbamoyloxy group (preferably a substituted or unsubstituted carbamoyloxy group having from 1 to 30 carbon atoms, e.g., N,N-dimethylcarbamoyloxy, N,N-diethylcarbamoyloxy, morpholinocarbonyloxy, N,N-di-n-octylaminocarbonyloxy, N-n-octylcarbamoyloxy)

(17) Alkoxycarbonyloxy group (preferably a substituted or unsubstituted alkoxycarbonyloxy group having from 2 to 30 carbon atoms, e.g., methoxycarbonyloxy, ethoxycarbonyloxy, tert-butoxycarbonyloxy, n-octylcarbonyloxy)

(18) Aryloxycarbonyloxy group (preferably a substituted or unsubstituted aryloxycarbonyloxy group having from 7 to 30 carbon atoms, e.g., phenoxycarbonyloxy, p-methoxyphenoxycarbonyloxy, p-n-hexadecyloxyphenoxycarbonyloxy)

(19) Amino group (preferably an amino group, a substituted or unsubstituted alkylamino group having from 1 to 30 carbon atoms or a substituted or unsubstituted anilino group having from 6 to 30 carbon atoms, e.g., amino, methylamino, dimethylamino, anilino, N-methyl-anilino, diphenylamino)

(20) Ammonio group (preferably an ammonio group or an ammonio group substituted by a substituted or unsubstituted alkyl, aryl or heterocyclic group having from 1 to 30 carbon atoms, e.g., trimethylammonio, triethylammonio, diphenylmethylammonio)

(21) Acylamino group (preferably a formylamino group, a substituted or unsubstituted alkylcarbonylamino group having from 1 to 30 carbon atoms or a substituted or unsubstituted arylcarbonylamino group having from 6 to 30 carbon atoms, e.g., formylamino, acetylamino, pivaloylamino, lauroylamino, benzoylamino, 3,4,5-tri-n-octyloxyphenylcarbonylamino)

(22) Aminocarbonylamino group (preferably a substituted or unsubstituted aminocarbonylamino group having from 1 to 30 carbon atoms, e.g., carbamoylamino, N,N-dimethylaminocarbonylamino, N,N-diethylaminocarbonylamino, morpholinocarbonylamino)

(23) Alkoxycarbonylamino group (preferably a substituted or unsubstituted alkoxycarbonylamino group having from 2 to 30 carbon atoms, e.g., methoxycarbonylamino, ethoxycarbonylamino, tert-butoxycarbonylamino, n-octadecyloxycarbonylamino, N-methyl-methoxycarbonylamino)

(24) Aryloxycarbonylamino group (preferably a substituted or unsubstituted aryloxycarbonylamino group having from 7 to 30 carbon atoms, e.g., phenoxycarbonylamino, p-chlorophenoxycarbonylamino, m-(n-octyloxy)phenoxycarbonylamino)

(25) Sulfamoylamino group (preferably a substituted or unsubstituted sulfamoylamino group having from 0 to 30 carbon atoms, e.g., sulfamoylamino, N,N-dimethylaminosulfonylamino, N-n-octylaminosulfonylamino)

(26) Alkyl- or aryl-sulfonylamino group (preferably a substituted or unsubstituted alkylsulfonylamino group having from 1 to 30 carbon atoms or a substituted or unsubstituted arylsulfonylamino group having from 6 to 30 carbon atoms, e.g., methylsulfonylamino, butylsulfonylamino, phenylsulfonylamino, 2,3,5-trichlorophenylsulfonylamino, p-methylphenylsulfonylamino)

(27) Mercapto group

(28) Alkylthio group (preferably a substituted or unsubstituted alkylthio group having from 1 to 30 carbon atoms, e.g., methylthio, ethylthio, n-hexadecylthio)

(29) Arylthio group (preferably a substituted or unsubstituted arylthio group having from 6 to 30 carbon atoms, e.g., phenylthio, p-chlorophenylthio, m-methoxyphenylthio)

(30) Heterocyclic thio group (preferably a substituted or unsubstituted heterocyclic thio group having from 2 to 30 carbon atoms, e.g., 2-benzothiazolylthio, 1-phenyltetrazol-5-ylthio)

(31) Sulfamoyl group (preferably a substituted or unsubstituted sulfamoyl group having from 0 to 30 carbon atoms, e.g., N-ethylsulfamoyl, N-(3-dodecyloxypropyl)sulfamoyl, N,N-dimethylsulfamoyl, N-acetylsulfamoyl, N-benzoylsulfamoyl, N—(N'-phenylcarbamoyl)sulfamoyl)

(32) Sulfo group

(33) Alkyl- or aryl-sulfinyl group (preferably a substituted or unsubstituted alkylsulfinyl group having from 1 to 30 carbon atoms or a substituted or unsubstituted arylsulfinyl group having from 6 to 30 carbon atoms, e.g., methylsulfinyl, ethylsulfinyl, phenylsulfinyl, p-methylphenylsulfinyl)

(34) Alkyl- or aryl-sulfonyl group (preferably a substituted or unsubstituted alkylsulfonyl group having from 1 to 30 carbon atoms or a substituted or unsubstituted arylsulfonyl group having from 6 to 30 carbon atoms, e.g., methylsulfonyl, ethylsulfonyl, phenylsulfonyl, p-methylphenylsulfonyl)

(35) Acyl group (preferably a formyl group, a substituted or unsubstituted alkylcarbonyl group having from 2 to 30 carbon atoms, a substituted or unsubstituted arylcarbonyl group having from 7 to 30 carbon atoms or a substituted or unsubstituted heterocyclic carbonyl group having from 4 to 30 carbon atoms and being bonded to a carbonyl group through a carbon atom, e.g., acetyl, pivaloyl, 2-chloroacetyl, stearoyl, benzoyl, p-n-octyloxyphenylcarbonyl, 2-pyridylcarbonyl, 2-furylcarbonyl)

(36) Aryloxycarbonyl group (preferably a substituted or unsubstituted aryloxycarbonyl group having from 7 to 30 carbon atoms, e.g., phenoxycarbonyl, o-chlorophenoxycarbonyl, m-nitrophenoxycarbonyl, p-tert-butylphenoxycarbonyl)

(37) Alkoxycarbonyl group (preferably a substituted or unsubstituted alkoxycarbonyl group having from 2 to 30 carbon atoms, e.g., methoxycarbonyl, ethoxycarbonyl, tert-butoxycarbonyl, n-octadecyloxycarbonyl)

(38) Carbamoyl group (preferably a substituted or unsubstituted carbamoyl group having from 1 to 30 carbon atoms, e.g., carbamoyl, N-methylcarbamoyl, N,N-dimethylcarbamoyl, N,N-di-n-octylcarbamoyl, N-(methylsulfonyl)-carbamoyl)

(39) Aryl- or heterocyclic-azo group (preferably a substituted or unsubstituted arylazo group having from 6 to 30 carbon atoms or a substituted or unsubstituted heterocyclic-azo group having from 3 to 30 carbon atoms, e.g., phenylazo, p-chlorophenylazo, 5-ethylthio-1,3,4-thiadiazol-2-ylazo)

(40) Imido group (preferably N-succinimido, N-phthalimido)

(41) Phosphino group (preferably a substituted or unsubstituted phosphino group having from 2 to 30 carbon atoms, e.g., dimethylphosphino, diphenylphosphino, methylphenoxyphosphino)

(42) Phosphinyl group (preferably a substituted or unsubstituted phosphinyl group having from 2 to 30 carbon atoms, e.g., phosphinyl, dioctyloxyphosphinyl, diethoxyphosphinyl)

(43) Phosphinyloxy group (preferably a substituted or unsubstituted phosphinyloxy group having from 2 to 30 carbon atoms, e.g., diphenoxyphosphinyloxy, dioctyloxyphosphinyloxy)

(44) Phosphinylamino group (preferably a substituted or unsubstituted phosphinylamino group having from 2 to 30 carbon atoms, e.g., dimethoxyphosphinylamino, dimethylaminophosphinylamino)

(45) Phospho group

(46) Silyl group (preferably a substituted or unsubstituted silyl group having from 3 to 30 carbon atoms, e.g., trimethylsilyl, triethylsilyl, tri(iso-propyl)silyl, tert-butyldimethylsilyl, phenyldimethylsilyl)

(47) Hydrazino group (preferably a substituted or unsubstituted hydrazino group having from 0 to 30 carbon atoms, e.g., trimethylhydrazino)

(48) Ureido group (preferably a substituted or unsubstituted ureido group having from 0 to 30 carbon atoms, e.g., N,N-dimethylureido)

The substituents represented by two W may also have a structure condensed with a ring, e.g., an aromatic or non-aromatic hydrocarbon ring, a heterocyclic ring or a polycyclic condensed ring formed by the combination of these rings, e.g., a benzene ring, a naphthalene ring, an anthracene ring, a phenanthrene ring, fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, a indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiine ring, a phenothiazine ring, a phenazine ring. For the solubility of the phthalocyanine compounds to a solvent, substituents other than an aromatic ring are preferable.

Among these substituents W, those having a hydrogen atom may be deprived of the hydrogen atom and substituted by the above-described substituent. Examples of these substituents include —CONHSO$_2$— group (sulfonylcarbamoyl group, carbonylsulfamoyl group), —CONHCO— group (carbonylcarbamoyl group), and —SO$_2$NHSO$_2$— group (sulfonylsulfamoyl group).

Specific examples thereof include an alkylcarbonylaminosulfonyl group (e.g., acetylaminosulfonyl group), an arylcarbonylaminosulfonyl group (e.g., benzoylaminosulfonyl group), an alkylsulfonylaminocarbonyl group (e.g., methylsulfonylaminocarbonyl group), and an arylsulfonylaminocarbonyl group (e.g., p-methylphenylsulfonylaminocarbonyl group).

In formulas (PC-1), $R^1$ to $R^{16}$ each independently represents a hydrogen atom or a substituent. They include at least two different substituents. Examples of the substituents include the above-described W. Of the two or more substituents, preferably at least one is an electron-attracting group, more preferably at least two are electron-attracting groups. One of the electron-attracting substituents is preferably a fluorine atom or chlorine atom, and more preferably a fluorine atom. Accordingly, the most preferably, at least one of the substituents is a fluorine atom, and at least one of the substituents is an electron-attracting group other than a fluorine atom, which is correspond to a compound represented by the formula (PC-1a).

As the electron-attracting group herein used, any electron-attracting group can be used. Examples of the electron-attracting group include a halogen atom, a cyano group, a nitro group, —COR, —CO COR, —SOR, —SO$_2$R, —CNR'R, —SNR'R, —S(NR')$_2$R, —POR$_2$, —OR", —SR", —NR'COR, —NR'SOR, —NR'SO$_2$R, —NR'CNR'R, —NR'S(NR')$_2$R, and —NR'POR$_2$. Herein, R represents a hydrogen atom, an alkyl group, an aryl group, a heterocyclic group, an amino group, an alkyl oxy group, an aryl oxy group, a heterocyclic oxy group, a hydroxyl group, an alkylthio group, an arylthio group, a heterocyclic thio group, or a mercapto (SH) group. Specific examples of these groups are the same as the exemplary groups of these groups set forth in W. R' represents a hydrogen atom, an alkyl group, an aryl group, a heterocyclic group, an acyl group, a sulfonyl group, a sulfinyl group, or a phosphoryl group. Specific examples of these groups are the same as the exemplary groups of these groups set forth in W. R" represents a perfluoroalkyl group, a cyano group, an acyl group, a sulfonyl group, or a sulfinyl group. Specific examples of these groups are the same as the exemplary groups of these groups set forth in W.

The substituent represented by R, R' or R" may further have a substituent(s) (e.g., the substituent represented by W). Examples of the substituent include a halogen atom (a fluorine atom, a chlorine atom, a bromine atom or an iodine atom), an alkyl group (including an aralkyl group, a cycloalkyl group and an active methine group, and the like), an alkenyl group, an alkynyl group, an aryl group, a heterocyclic group (substitution position not questioned), a heterocyclic group containing a quaternary nitrogen atom (e.g., a pyridinio group, an imidazolio group, a quinolinio group and an isoquinolinio group), an acyl group, an alkoxycarbonyl group, an aryloxycarbonyl group, a carbamoyl group, a carboxyl group or a salt thereof, a sulfonylcarbamoyl group, an acylcarbamoyl group, a sulfamoylcarbamoyl group, a carbazoyl group, an oxalyl group, an oxamoyl group, a cyano group, a thiocarbamoyl group, a hydroxy group, an alkoxy group (including a group containing ethyleneoxy or propyleneoxy units as repeating units), an aryloxy group, a heterocyclic oxy group, an acyloxy group, an alkoxy- or aryloxy-carbonyloxy group, a carbamoyloxy group, a sulfonyloxy group, an amino group, an alkyl-, aryl- or heterocyclic-amino group, an amino, an acylamino group, a sulfonamido group, a ureido group, a thioureido group, an imido group, an alkoxy- or aryloxy-carbonylamino group, a sulfamoylamino group, a semicarbazide group, a thiosemicarbazide group, a hydrazino group, an ammonio group, an oxamoylamino group, an alkyl- or aryl-sulfonylureido group, an acylureido group, an acylsulfamoylamino group, a nitro group, a mercapto group, an alkyl-, aryl-, or heterocyclic-thio group, an alkyl- or aryl-sulfonyl group, an alkyl- or aryl-sulfinyl group, a sulfo group or a salt thereof, a sulfamoyl group, an acylsulfamoyl group, an sulfonylsulfamoyl group or a salt thereof, a group having a phosphonamide or phosphate structure, a silyloxy group (e.g., trimethylsilyloxy, tert-butyldimethylsilyloxy), and a silyl group (e.g., trimethylsilyl, tert-butyldimethylsilyl, phenyldimethylsilyl).

As the electron-attracting group in formula (PC-1) or (PC-1a), a group represented by -$L^1$-$R^{17}$ is preferably used. Herein, $L^1$ represents a group selected from a member consisting of **—SO$_2$—*, **—SO$_3$—*, **—SO$_2$N(—)$_2$*, **—SO—*, **—CO—*, **—CON(—)$_2$*, **—COO—*, **—CO CO$_2$—*, and **—CO CON(—)$_2$*. The symbol ** indicates a position of bonding to a phthalocyanine skeleton, while the symbol * indicates a position of bonding to $R^{17}$. In the case that a plurality of $R^{17}$ binds, they may be the same or different from each other.

$L^1$ is preferably **—SO$_2$—*, **—SO$_2$N(—)$_2$*, **—CO—*, **—CON(—)$_2$*, or **—COO—*, more preferably **—SO$_2$—*, **—SO$_2$N(—)$_2$*, or **—CON(—)$_2$*, especially preferably **—SO$_2$—*, or **—SO$_2$N(—)$_2$*.

$R^{17}$ represents a hydrogen atom, an alkyl group, an aryl group, or a heterocyclic group. Specific examples of these groups are the same as the exemplary groups of these groups set forth in W. $R^{17}$ is preferably an alkyl group, an aryl group, or a heterocyclic group. In the case that $R^{17}$ is an alkyl group, an aryl group, or a heterocyclic group, these groups may be further substituted with other substituents (for example, those substituents set forth in W).

$R^{17}$ is more preferably an alkyl group, or an aryl group, and especially preferably an alkyl group. The groups of $R^{17}$ have from 1 to 30 carbon atoms, preferably from 1 to 20 carbon atoms, and especially preferably from 1 to 10 carbon atoms. Besides, the case where $R^{17}$ has a branch alkyl group is preferable from the viewpoint of improvement in solubility to solvents.

Even though at least one of the substituents of $R^1$ to $R^{16}$ is preferably a fluorine atom, the number of fluorine atom is preferably two (2) or more, more preferably four (4) or more, further more preferably eight (8) or more, and particularly preferably twelve (12). The upper limit of the number of fluorine atom is preferably fifteen (15). In the case where the number of fluorine atom is four (4) or more, it is preferable that these fluorine atoms are located on the same benzene ring, namely any one of the group $R^1$ to $R^4$, $R^5$ to $R^8$, $R^9$ to $R^{12}$, or $R^{13}$ to $R^{16}$ is wholly substituted with fluorine atoms. In the case where the number of fluorine atom is four (4) or more, it is preferable that each of $R^1$ to $R^4$ is a fluorine atom. In the case where the number of fluorine atom is eight (8) or more; it is preferable that $R^1$ to $R^4$ and $R^5$ to $R^8$, or $R^1$ to $R^4$ and $R^9$ to $R^{12}$ are entirely fluorine atoms. In the case where the number of fluorine atom is twelve (12), it is preferable that $R^1$ to $R^4$ and $R^5$ to $R^8$ and $R^9$ to $R^{12}$ are entirely fluorine atoms.

As long as at least one of the substituents is preferably an electron-attracting group other than a fluorine atom, and the number of an electron-attracting group may be in the range from 1 to 15. There is no particular limitation thereof, however the number is preferably in the range of from 1 to 4. Electron-attracting groups may be located on the benzene ring substituted with fluorine atoms. Namely, the electron-attracting groups may be belonged to a group of $R^1$ to $R^4$, $R^5$ to $R^8$, $R^9$ to $R^{12}$, or $R^3$ to $R^{16}$ same as, or different from, the group in that a fluorine atom is substituted. However, each of the electron-attracting group and the fluorine atom may preferably be belonged to each of (different) groups.

In the case of plural electron-attracting groups, they may be the same or different from each other, with the same groups being preferable.

With respect to a phthalocyanine compound having a plurality of substituents, generally there can be positional isomers that are different from each other in the bonding position of the substituent. There is no exception also in the phthalocyanine compound represented by formula (PC-1) or (PC-1a) used for the present invention, and several kinds of positional isomers thereof are considered according to the occasion. In the present invention, phthalocyanine compound may be a single compound, or a mixture of positional isomers. In the case where the compound is a mixture of positional isomers, the number of positional isomers to be mixed, the substitution position of substituents of the positional isomers, and a mixture ratio of the positional isomers are not particularly limited.

In formulas (PC-1) or (PC-1a), M represents a metallic atom or two hydrogen atoms; the two hydrogem atoms bond to a nitrogen atom of an isoindole ring and to a nitrogen atom of an isoindoline ring respectively, when M represents two hydrogen atoms. In the case that M represents a metal atom, it may be any metal as long as it forms a stable complex, examples thereof include Li, Na, K, Be, Mg, Ca, Ba, Al, Si, Hg, Cr, Fe, Co, Ni, Cu, Zn, Ge, Pd, Cd, Sn, Pt, Pb, Sr, V, Mn, Ti, In, and Ga. The metal atom may be combined with a substituent, and the substituent may be W which will be described later. M is preferably Mg, Ca, AlCl, $SiCl_2$, Fe, Co, Ni, Cu, Zn, Pd, Sn, $SnCl_2$, Pt, Pb, VO, Mn, or TiO, more preferably Fe, Co, Ni, Cu, or Zn, and most preferably Cu.

In the case that M represents two hydrogen atoms in the above-described formula (PC-1), the compound is represented by the formula (PC-1'). Herein, $R^1$ to $R^{16}$ has the same meanings as those of $R^1$ to $R^{16}$ in the formula (PC-1) described above.

In the present invention, it is preferable that the compound represented by formula (PC-1) is a compound represented by formula (PC-2) described above. Hereinafter, formula (PC-2) is explained.

In the above-described formula (PC-2), M has the same meanings as those of M in the above-described formula (PC-1), and the preferable range is also the same as that of (PC-1). $R^5$ to $R^{16}$ each independently represents a hydrogen atom or a substituent. $R^5$ to $R^{16}$ each has the same meanings as those of formula (PC-1). Examples of the substituent are the same as in the formula (PC-1) and preferable substituents are also same. At least one of $R^5$ to $R^{16}$ is —$SO_2R^{17}$ or —$SO_2N(R^{17})_2$. A plurality of $R^{17}$ may be the same or different from each other. $R^{17}$ represents a hydrogen atom, an alkyl group, an aryl group or a heterocyclic group. $R^{17}$ has the same meanings as those of the formula (PC-1). Examples of the substituent are the same as in the above-described formula (PC-1) and preferable substituents are also same. In the case of a plurality of —$SO_2R^{17}$ or —$SO_2N(R^{17})_2$, they may be the same or different from each other. The case of the same groups is preferable.

The following is an explanation of preferable embodiments relating the compound represented by formula (PC-2).

It is preferably at least one of $R^1$ to $R^{16}$ is a fluorine atom, more preferably the number of fluorine atom is four (4) or more, especially preferably eight (8) or more. The upper limit of the number of fluorine atom is preferably eleven (11). In the case where the number of fluorine atoms is four (4) or more, it is preferable that these fluorine atoms are located on the same benzene ring, namely any one of the group $R^5$ to $R^8$, $R^9$ to $R^{12}$, or $R^{13}$ to $R^{16}$ is wholly substituted with fluorine atoms. In the case where the number of fluorine atoms is four (4) or more, it is preferable that $R^5$ to $R^8$ or $R^9$ to $R^{12}$ is a fluorine atom. In the case where the number of fluorine atom is eight (8) or more, it is preferable that $R^5$ to $R^8$ and $R^9$ to $R^{12}$ are fluorine atoms.

The formula (PC-2a) and (PC-2b) describe the formula (PC-1) having four (4) or more fluorine atoms as substituents of $R^5$ to $R^{16}$. In the formula (PC-2a) and (PC-2b), M and $R^5$ to $R^{16}$ has the same meanings as those of M and $R^5$ to $R^{16}$ in the formula (PC-1), and the preferable range is also the same as that of (PC-1).

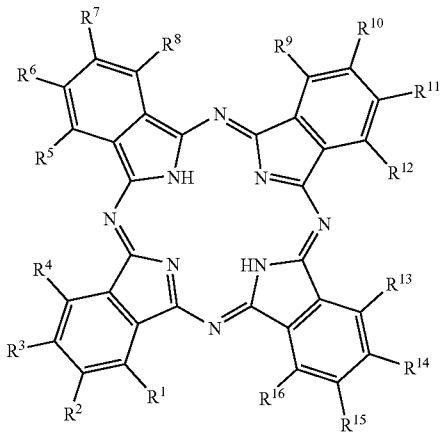

Formula (PC-1')

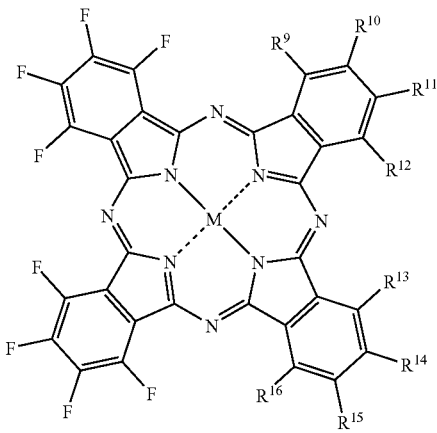

Formula (PC-2a)

Formula (PC-2b)

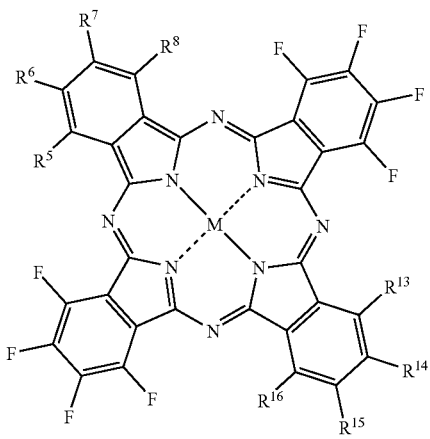

In the formulas (PC-2a) and (PC-2b), at least one of $R^5$ to $R^{16}$ is —$SO_2R^7$ or —$SO_2N(R^{17})_2$. As the number of —$SO_2R^7$ or —$SO_2N(R^7)_2$, there is no particular limitation, in so far as the number is in the range of from 1 to 8, however the number is preferably in the range of from 1 to 4. Further, in the case that at least one of $R^5$ to $R^{16}$ is a fluorine atom, —$SO_2R^{17}$ or —$SO_2N(R^{17})_2$ may be located on a benzene ring in which at least one fluorine atom is substituted. That is, —$SO_2R^{17}$ or —$SO_2N(R^{17})_2$ may be located on a group of $R^5$ to $R^8$, $R^9$ to $R^{12}$, or $R^{13}$ to $R^{16}$, same as, or different from, the group in that at least one fluorine atom is substituted, but —$SO_2$—$R^{17}$ or —$SO_2N(R^{17})_2$ is preferably belonged to a group different from the groups in that a fluorine atom is substituted.

In common with the above-described formula (PC-1), the compound of the present invention represented by the formula (PC-2) may be a single compound, or a mixture of positional isomers. In the case where the compound is a mixture of positional isomers, the number of positional isomers to be mixed, the substitution position of substituents of the positional isomers, and a mixture ratio of the positional isomers are not particularly limited.

In the present invention, it is preferable that a compound represented by the formula (PC-1) is a compound represented in the below formula (PC-3) described above.

In the formula (PC-3), M has the same meanings as those of M in the formula (PC-1), and the preferable range is also the same as that of (PC-1). $R^{13}$ to $R^{16}$ each independently represents a hydrogen atom or a substituent, and $R^{13}$ to $R^{16}$ each has the same meanings as those of formula (PC-2). Examples of the substituents are the same as in the formula (PC-2) and preferable substituents are also same. At least one of the substituents is —$SO_2R^{17}$ or —$SO_2N(R^{17})_2$. A plurality of $R^{17}$ may be the same or different from each other. $R^{17}$ has the same meanings as those of the formula (PC-1). Examples of the substituent are the same as in formula (PC-1) and preferable substituents are also same. In the case of a plurality of —$SO_2R^{17}$ or —$SO_2N(R^{17})_2$, they may be the same or different from each other, but the case of the same groups is preferable. The number of —$SO_2R^{17}$ or —$SO_2N(R^{17})_2$ may be in the range from 1 to 4.

In common with the formula (PC-2), a compound of the present invention represented by the formula (PC-3) may be a single compound, or a mixture of positional isomers. In the case where the compound is a mixture of positional isomers, the number of positional isomers to be mixed, the substitution position of substituents of the positional isomers, and a mixture ratio of the positional isomers are not particularly limited.

It is preferable that the organic semiconductor of the present invention does not substantially contain a compound in which all of the substituents of $R^1$ to $R^{16}$ in the formula (PC-1) are fluorine atoms, namely a compound represented by the formula (PC-4). The term "does not substantially contain" means that the content of a compound represented by the formula (PC-4) with reference to the total content of compounds represented by the formulae (PC-1), (PC-2), and/or (PC-3) is 50 mol % or less. In the organic semiconductor of the present invention, the above-described content of a compound represented by formula (PC-4) is more preferably 40 mol % or less, and further preferably 30 mol % or less.

Formula (PC-4)

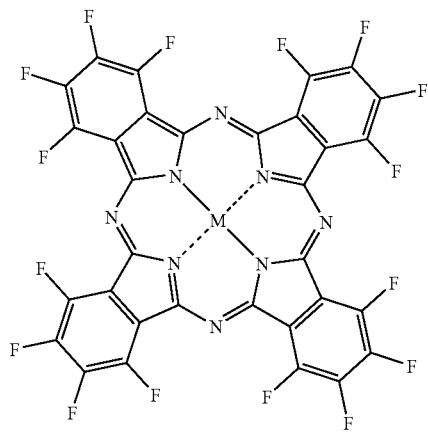

In the formula (PC-3), M has the same meanings as those of M in the formula (PC-1), and the preferable range is also the same as that of the formula (PC-1).

A preferable embodiment of the compound according to the present invention is a phthalocyanine derivative having not only an electron-attractive fluorine atom, but also an electron-attractive group exhibiting both electron-attracting property and ability to improve solubility. Since such a phthalocyanine derivative has a high solubility to a solvent, a thin film can be formed through a wet process. Furthermore, since the phthalocyanine derivative has a proper energy level, the phthalocyanine derivative exhibits excellent characteristics of n-type semiconductor in particular and also high stability in atmosphere. In the past, although there was no compound entirely satisfying such the characteristics, the present invention has enabled to satisfy these characteristics.

Specific examples of the compound represented by the above-described formula (PC-1), (PC-1a), (PC-2), or (PC-3) used in the present invention are shown below. However, the present invention should not be construed as being limited to these embodiments. Further, in examples of compounds, the compounds represented by the formula (P-2), (P-3), (P-5), or (P-6) represents a positional isomer as a compound.

Formula (P-1)
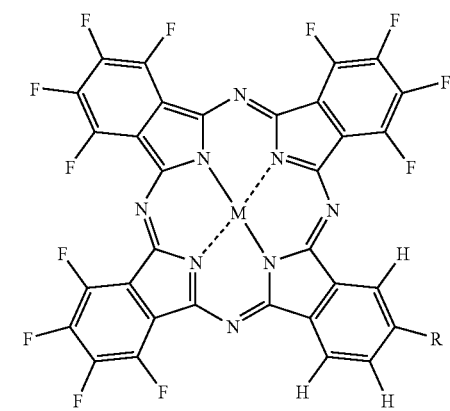
Formula (P-2)
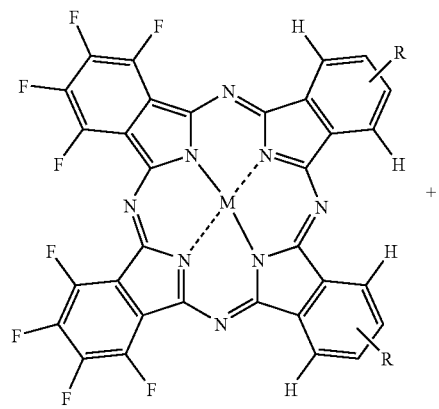
Formula (P-3)
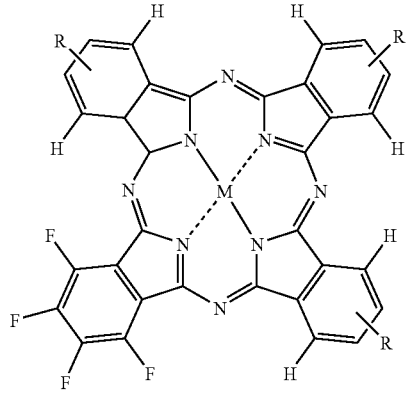
Formula (P-4)
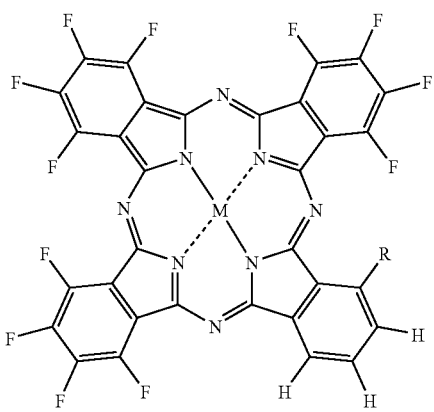
Formula (P-5)
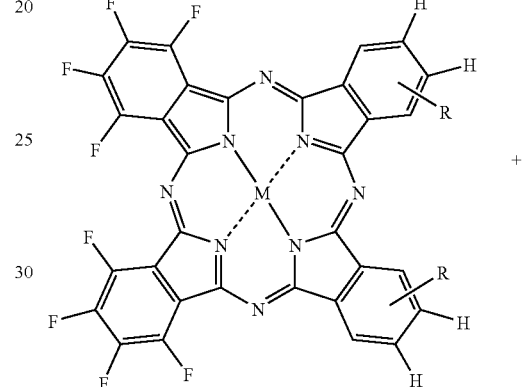
Formula (P-6)
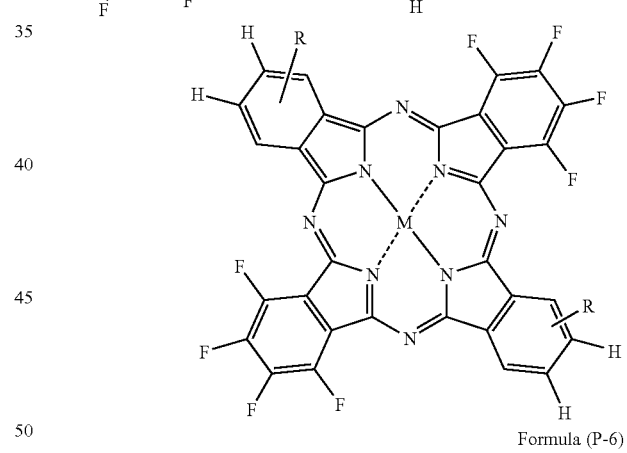

TABLE 1

| Compound | Formula | M | R |
|---|---|---|---|
| P-1-1 | P-1 | Cu | $SO_2(CH_2)_7CH_3$ |
| P-1-2 | P-1 | Cu | $SO_2(CH_2)_2(CF_2)_5CF_3$ |
| P-1-3 | P-1 | Cu | –SO$_2$–C(CH$_3$)$_2$–(CH$_2$)$_{10}$CH$_3$ |
| P-1-4 | P-1 | Cu | –SO$_2$–CH$_2$–CH(C$_2$H$_5$)(CH$_2$)$_3$CH$_3$ (2-ethylhexyl) |
| P-1-5 | P-1 | Cu | –SO$_2$–CH(CH$_3$)C$_2$H$_5$ |
| P-1-6 | P-1 | Cu | –SO$_2$–C(CH$_3$)$_3$ |
| P-1-7 | P-1 | Cu | –SO$_2$–N[(CH$_2$)$_5$CH$_3$]$_2$ |
| P-1-8 | P-1 | Cu | –SO$_2$(CH$_2$)$_3$C(O)O–CH(CH$_3$)CH$_2$OMe |
| P-1-9 | P-1 | Zn | $SO_2(CH_2)_7CH_3$ |
| P-1-10 | P-1 | H$_2$ | $SO_2(CH_2)_7CH_3$ |
| P-2-1 | P-2 | Cu | $SO_2(CH_2)_7CH_3$ |
| P-2-2 | P-2 | Cu | $SO_2(CH_2)_2(CF_2)_5CF_3$ |
| P-2-3 | P-2 | Cu | –SO$_2$–C(CH$_3$)$_2$–(CH$_2$)$_{10}$CH$_3$ |
| P-2-4 | P-2 | Cu | –SO$_2$–CH$_2$–CH(C$_2$H$_5$)(CH$_2$)$_3$CH$_3$ |
| P-2-5 | P-2 | Cu | –SO$_2$–CH(CH$_3$)C$_2$H$_5$ |
| P-2-6 | P-2 | Cu | –SO$_2$–C(CH$_3$)$_3$ |
| P-2-7 | P-2 | Cu | –SO$_2$–N[(CH$_2$)$_5$CH$_3$]$_2$ |
| P-2-8 | P-2 | Cu | –SO$_2$(CH$_2$)$_3$C(O)O–CH(CH$_3$)CH$_2$OMe |
| P-2-9 | P-2 | Zn | $SO_2(CH_2)_7CH_3$ |
| P-2-10 | P-2 | H$_2$ | $SO_2(CH_2)_7CH_3$ |

TABLE 2

| Compound | Formula | M | R |
|---|---|---|---|
| P-3-1 | P-3 | Cu | $SO_2(CH_2)_7CH_3$ |
| P-3-2 | P-3 | Cu | $SO_2(CH_2)_2(CF_2)_5CF_3$ |
| P-3-3 | P-3 | Cu | –SO$_2$–C(CH$_3$)$_2$–(CH$_2$)$_{10}$CH$_3$ |
| P-3-4 | P-3 | Cu | –SO$_2$–CH$_2$–CH(C$_2$H$_5$)(CH$_2$)$_3$CH$_3$ |
| P-3-5 | P-3 | Cu | –SO$_2$–CH(CH$_3$)C$_2$H$_5$ |
| P-3-6 | P-3 | Cu | –SO$_2$–C(CH$_3$)$_3$ |
| P-3-7 | P-3 | Cu | –SO$_2$–N[(CH$_2$)$_5$CH$_3$]$_2$ |
| P-3-8 | P-3 | Cu | –SO$_2$(CH$_2$)$_3$C(O)O–CH(CH$_3$)CH$_2$OMe |
| P-3-9 | P-3 | Zn | $SO_2(CH_2)_7CH_3$ |
| P-3-10 | P-3 | H$_2$ | $SO_2(CH_2)_7CH_3$ |
| P-4-1 | P-4 | Cu | $SO_2(CH_2)_7CH_3$ |
| P-5-1 | P-5 | Cu | $SO_2(CH_2)_7CH_3$ |
| P-6-1 | P-6 | Cu | $SO_2(CH_2)_7CH_3$ |

A phthalocyanine ring-forming reaction for producing the compound of the present invention can be performed according to "Futarosianin-Kagaku to Kinou-(Phthalocyanine-Chemistry and Function-) authored by Hirohusa Sirai and Osao Kobayasi, IPC company (edition in 1997), pp. 1 to 62 and "Kinousei sikiso to si te no Futarosianin (Phthalocyanine as a functional dye)", compiled by Akira Hirohashi, Keiichi Sakamoto and Eiko Okumura, IPC company (edition in 2004), pp. 29 to 77.

Typical examples of the method for synthesizing phthalocyanine derivatives include Weiler method, a phthalonitrile method, a lithium method, a subphthalocyanine method, and a chlorinated phthalonitrile method. The phthalonitrile method is preferably applied to the present invention. In the case of synthesizing phthalocyanine derivatives that contain isoindoline rings having different structures in the ratio of 1:3, 2:2, or 3:1, there can be obtained phthalocyanine mixtures containing, as a primary product, phthalocyanine derivatives having an intended ratio of isoindoline rings by means of, for example, a method of mixing and reacting two or more kinds of phthalonitrile derivatives in a desired ratio. This method is inferior to the subphthalocyanine method in reaction selectivity, but a synthesis method having an advantage of a relatively short production process. In order to obtain phthalocyanine derivatives in the ratio of 1:3 or 3:1 selectively, there can be preferably used a subphthalocyanine method of reacting, for example, a subphthalocyanine derivative composed of boron as a center and three isoindoline rings with a different kind of 1,3-diiminoindoline derivative or the like.

In the phthalocyanine ring-forming reaction, there is no particular limitation to reaction conditions. In the ring-forming reaction, it is preferable to add various kinds of metal that acts as a central metal. However, after synthesizing a phthalocyanine derivative free of a central metal, a desired metal may be introduced to the phthalocyanine derivative.

As a reaction solvent, there is no particular limitation, but a high boiling point solvent is preferable. Beside, an acid or a base is preferably used so as to accelerate a ring-forming reaction, with the base being especially preferred. Optimum reaction conditions are different depending on the structure of an objective phthalocyanine derivative, however they can be determined in reference to specific reaction conditions described in the above-described literatures.

As raw materials used in the synthesis of the phthalocyanine derivative, there can be used phthalic acid anhydride, phthalimide, phthalic acid and a salt thereof, phthalic acid diamide, phthalonitrule, 1,3-diiminoindoline, etc. and derivatives thereof. These raw materials may be synthesized through any conventional synthesis method.

To synthesize the compound of the present invention, there can be preferably used a method of using a reaction of, for example, a phthalonitrile substituted with a fluorine atom and another phthalonitrile substituted with an electron attractive group excluding a fluorine atom.

The term "organic semiconductor" in the present invention means an organic material exhibiting semiconductor characteristics. Similar to the inorganic semiconductor, there are p-type semiconductor conducting positive holes as a carrier and n-type semiconductor conducting electrons as a carrier. The flowability of the carrier in the organic semiconductor is expressed as carrier mobility µ. Mobility is preferably higher, more preferably $10^{-7}$ cm$^2$/Vs or higher, and further preferably $10^{-5}$ cm$^2$/Vs or higher. Mobility can be determined by characteristics of the field-effect transistor (FET) device, or by the time of flight type (TOF) method.

As the electronic device used in the present invention, there is no particular limitations. But, it is preferable that an electronics device having a thin film layer structure is used in the electronic device. Examples of the semiconductor electronic device using such an electronics device according to the present invention include organic photoelectric conversion devices, organic field-effect transistors, organic electroluminescence devices, gas sensor, organic rectifier devices, organic inverters, and information recording devices. The organic photoelectric conversion devices can be applied to any of photo-sensor use and energy conversion use. Preferably used are organic photoelectric conversion devices, organic field-effect transistors, and organic electroluminescence devices. More preferably used are organic photoelectric conversion devices and organic field-effect transistors. The organic photoelectric conversion device is especially preferred. Hereinafter, regarding to preferable embodiments of these devices, typical ones are explained in detail with reference to figures. However, the present invention should not be construed as being limited to these embodiments.

FIG. 1 is a sectional view of schematically illustrating one embodiment of the organic field-effect transistor of the present invention. The transistor shown in FIG. 1 has a laminate structure as a basic structure. As an undermost layer, there is arranged a substrate 11 (for example, polyester films such as polyethylenenaphthalate (PEN) and polyethyleneterephthalate (PET), polyimide films, ceramics, silicon, quartz, and glass). An electrode 12 is arranged at a portion of the upper surface of the substrate and is covered. Further, an insulator layer 13 is prepared so as to cover said electrode therewith and also to contact with the substrate at the other portion than the electrode. Furthermore, an organic semiconductor layer 14 is prepared on an upper surface of the insulator layer 13, and moreover, at a portion of the upper surface of the organic semiconductor layer, there are arranged two electrodes 15a and 15b isolating from each other. The constituent materials of the electrodes 12, 15a, and 15b are not particularly limited as long as they exhibit electrical conductivity, and may be known conductive materials including metal materials such as Cr, Al, Ta, Mo, Nb, Cu, Ag, Au, Pt, Pd, In, Ni or Nd, alloy materials thereof, carbon materials, and electro-conductive polymers. The structure shown in FIG. 1 is called as a top contact type device. Besides, preferably used are bottom contact type device in which the two electrodes 15a and 15b are arranged at the back portion of the organic semiconductor layer.

The gate width (channel width) W and gate length (channel length) L are not particularly limited, but the ratio of W to L is preferably 10 or more, and more preferably 20 or more.

There is no particular limitation to the thickness of each layer. However, if thinner transistors are required, for example, a whole thickness of the transistor is preferably controlled to the range of from 0.1 to 0.5 µm. For achieving such the thickness control, a thickness of each layer is preferably controlled to the range of from 10 to 400 nm, whereas a thickness of electrode is preferably controlled to the range of from 10 to 50 nm.

Though, there is no particular limitation to the material constituting a insulator layer as long as obtaining required insulating effect, examples thereof include silicon dioxide, silicon nitride, polyester insulating materials, polycarbonate insulating materials, acrylic polymer-based insulating materials, epoxy resin-based insulating materials, polyimide insulating material, and polyparaxylylene resin-based insulating materials. The insulator layer 13 may have a surface-treated upper surface, and preferable example thereof include an insulator layer having a silicon dioxide surface coated with hexamethyldisilazane (HMDS) or octadecyltrichlorosilane (OTS).

For the sake of protecting the device from the air and moisture to improve the storage stability of the device, the whole device may be sealed with a metal sealing can, inorganic material such as glass and silicon nitride, or polymer material such as parylene.

Figure 2:
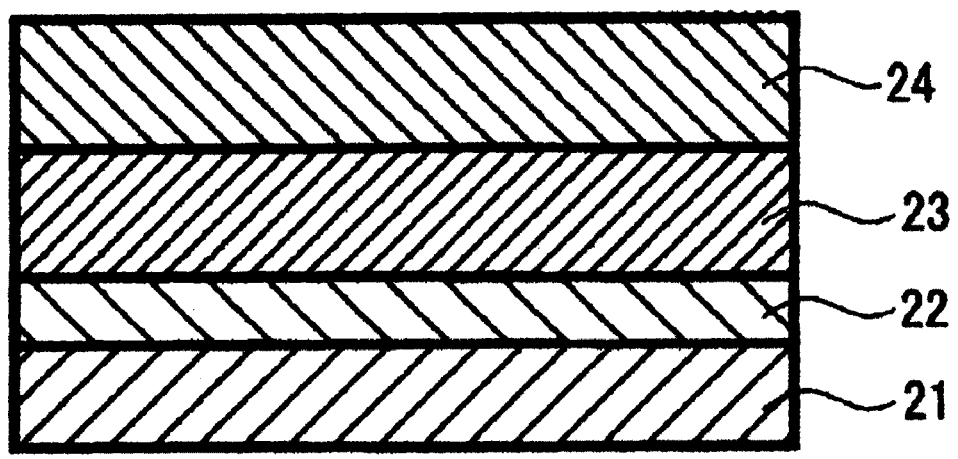
FIG. 2 is a sectional view of schematically illustrating one embodiment of an organic photoelectric conversion device of the present invention.

FIG. 2 is a sectional view of schematically illustrating one embodiment of the organic photoelectric conversion device of the present invention. The device shown in FIG. 2 has a laminate structure. Specifically, the device has the following constitution. As an undermost layer, there is arranged a substrate 21 (for example, polyester films such as polyethylenenaphthalate (PEN) and polyethyleneterephthalate (PET), polyimide films, ceramics, silicon, quartz, and glass). An electrode layer 22 is prepared on the upper surface of the substrate. As a further upper layer, there is prepared a layer 23 containing p-type semiconductor and/or n-type semiconductor. Furthermore, an electrode layer 24 is prepared on the upper surface of the semiconductor layer. Between the electrode layer 22 or 24 and the layer 23 containing p-type organic semiconductor and/or n-type organic semiconductor, a buffer layer for improving the surface smoothness, a carrier injecting layer for promoting the injection of holes or electrons from the electrodes, a carrier blocking layer for blocking holes or electrons, or other layers may be contained.

The material used as the electrode layer 22 is not particularly limited as long as it transmits visible or infrared light and possesses electrical conductivity. The transmittance of visible or infrared light is preferably 60% or more, more preferably 80% or more, and most preferably 90% or more. Preferable examples of the material include transparent conductive oxides such as ITO, IZO, $SnO_2$, ATO (antimony-doped tin oxide), ZnO, AZO (Al-doped zinc oxide), GZO (gallium-doped zinc oxide), $TiO_2$, and FTO (fluorine dope tin oxide). Among them, ITO and IZO are most preferable from the viewpoints of processability and smoothness.

The material used as the electrode layer 24 is not particularly limited as long as it possesses electrical conductivity, and preferably a material having high light reflectivity from the viewpoint of improving the efficiency for light utilization. Most preferable examples thereof include Al, Pt, W, Au, Ag, Ta, Cu, Cr, Mo, Ti, Ni, Pd, and Zn.

There is no particular limitation on the thickness of each layer. Preferable whole thickness, thickness of each layer and thickness of electrode are the same as those of the above-described transistor.

For the sake of improving the storage stability of the device, it is preferable to seal the whole device with a metal sealing can, an inorganic material such as glass or silicon nitride, or a polymer material such as parylene for protecting the device from the air and moisture.

In the case where the organic photoelectric conversion device is used as a solar cell for use of energy conversion, as it is required to efficiently absorb sun light thereby to enhance efficiency of energy conversion, it is preferable to use a material that absorbs a light of up to 600 nm or longer wavelength region, especially preferably up to a near infrared region of 700 nm or more, thereby to achieve photoelectrical conversion. The compound of the present invention is preferable from the viewpoint that said compound absorbs a light of up to the long wavelength region of 600 nm or more and/or 700 nm or more, thereby to achieve photoelectrical conversion.

As a method of forming a thin film containing an organic semiconductor compound of the present invention, there can be used any of a dry film forming process and a wet film forming process. Specific examples of the dry film production method include a physical vapor phase growth method such as a vacuum evaporation method, a spattering method, an ion plating method and a molecular beam epitaxy (MBE) method, and a chemical vapor deposition (CVD) method such as a plasma polymerization. As the wet film forming process, there is a method of dissolving an organic compound in a solvent capable of dissolving the organic compound, and making the resultant solution a thin coating. As the coating method, there can be used ordinary methods such as a cast process, a blade coating process, a wire bar coating process, a splay coating process, a dip (an immersion) coating process, a bead coating process, an air knife coating process, a curtain coating process, an ink jet coating process, a spin coating process, and a Langmuir-Blodgett (LB) process. Preferably there can be used a spin coating process and an ink jet coating process.

In the present invention, a thin film is preferably formed through a wet process (wet film forming process). A thin film containing the organic semiconductor compound of the present invention can be formed in the range of thickness from several nm to several mm through a wet film forming process. The film thickness is not particularly limited by the kind or the like of electronic devices, but the thickness is preferably in the range of 5 nm to 50 µm, and more preferably in the range of 20 nm to 500 nm.

In the case where a thin film layer containing an organic semiconductor compound may be formed through a wet film forming process, a layer-forming material or both said material and a binder resin are dissolved or dispersed in a proper organic solvent (e.g., hydrocarbons such as hexane, octane, decane, toluene, xylene, ethyl benzene, 1-methyl naphthalene and 1,2-dicyclobenzene; ketones such as acetone, methyl ethyl ketone, methyl isobutyl ketone and cyclohexanone; halogenated hydrocarbons such as dichloromethane, chloroform, tetrachloromethane, dichloroethane, trichloroethane, tetrachloroethane, chlorobenzene, dichlorobenzene, and chlorotoluene; esters such as ethyl acetate, butyl acetate, and amyl acetate; alcohols such as methanol, propanol, butanol, pentanol, hexanol, cyclohexanol, methylcellosolve, ethylcellosolve, and ethylene glycol; ethers such as dibutylether, tetrahydrofuran, dioxane, and anisole; polar solvents such as N,N-dimethylformamide, N,N-dimethylacetamide, 1-methyl-2-pyrrolidone, 1-methyl-2-imidazolidinone and dimethylsulfoxide) and/or water to prepare a coating liquid. A thin film can be formed using the thus-obtained coating liquid through various coating methods. A concentration of the phthalocyanine compound of the present invention in the coating liquid is preferably in the range of from 0.1 to 80% by mass, more preferably in the range of from 0.5 to 10% by mass. Control of the concentration to such the range enables to form a film having arbitrary thickness.

A resin binder may be used in an organic thin film layer. Examples of the resin binder in an organic thin film layer include insulating polymers such as polystylene, polycarbonate, polyarylate, polyester, polyamide, polyimide, polyurethane, polysiloxane, polysulfone, polymethylmethacrylate, polymethylacrylate, cellulose, polyethylene and polypropylene; and copolymers of these polymers; photoconductive polymers such as polyvinylcarbazol and polysilane, and electrically conductive polymers such as polythiophen, polypyrrole, polyaniline, and polypara phenylenevinilene. The resin binder may be used solely or, alternatively two or more kinds of the resin binder may be used in combination. Taking a mechanical strength of the thin film into consideration, preferred are resin binders having a high glass transition temperature. Whereas, taking a charge transfer degree into consideration, preferred are resin binders containing no polar group, photoconductive polymers and electrically conductive polymers. It is preferable in characteristics of the organic semiconductor not to use such the resin binder. But, the resin binder is sometimes used according to the purpose. In this case, an amount of the resin binder used is not particularly limited, but preferably the binder is used in the range of from 0.1 to 10% by mass, based on the organic semiconductor thin film layer.

The materials of the present invention are especially suitable for thin film forming through a wet film forming process. In order to form a thin film through a wet film forming process, it is necessary that said materials dissolve in the exemplified solvents. However, a sole characteristic that the material dissolves in the solvent is not enough. Usually, even the materials used for thin film forming through a dry process (dry film forming process), can be dissolved in a solvent to some degree. However, a wet film forming process contains the steps of dissolving a material in a solvent to prepare a thin coating, and thereafter evaporating the solvent to form a thin film. Many of the materials not suitable for the wet film forming process have high crystallinity. Therefore, it is difficult to form a satisfactory thin film because of crystallization of the material at these steps. The materials of the present invention are also excellent in the point that such the crystallization hardly occurs.

According to the present invention, there can be provided an organic semiconductor (preferably n-type semiconductor) and a compound therefor having high durability and capable of forming a thin film through wet film forming process (from a solution of the compound). Further, the present invention enables to provide a thin film and various kinds of electronic devices (e.g. field-effect transistor (FET), photoelectric conversion device that show light absorption even in a long wavelength region) each using the above-described organic semiconductor or compound.

The present invention will be described in more detail based on the following examples, but the invention is not intended to be limited thereto.

EXAMPLES

Example 1

(1-1) Exemplified Compounds (P-1-1), (P-2-1), and (P-3-1):

Synthesis of Intermediate (4-n-octylthiophthalonitrile (A-1))

While cooling a reaction vessel on a water bath, were mixed 17.3 g (100 mmol) of 4-nitrophthalonitrile, 15.7 g (110 mmol) of 1-octanethiol, 20.7 g (150 mmol) of potassium carbonate and 80 ml of N,N-dimethylacetamide. The resultant mixture was stirred for 7 hours at room temperature and then for 1 hour at 40° C. The thus-obtained reaction mixture was poured into 600 ml of a 3% hydrochloric acid. The resultant precipitates were separated by a filtration under reduced pressure, and then washed with water and dried. Thereafter, by recrystallization from a mixed solvent of methanol (190 ml)/water (9 ml), there was obtained 18.5 g (Yield: 68%) of white powder synthesis intermediate (A-1) (Melting point=37 to 38° C.).

$^1$HNMR (300 MHz, $CDCl_3$) δ=7.63 (d, 1H), 7.55 (d, 1H), 7.48 (dd, 1H), 3.00 (t, 2H), 1.77-1.67 (m, 2H), 1.51-1.25 (m, 10H), 0.88 (t, 3H)

Synthesis of Intermediate (4-n-octylsulfonylphthalonitrile (A-2))

In a mixed solvent of ethanol (35 ml)/acetic acid (1 ml), was dissolved 9.5 g (35 m mol) of 4-n-octylthiophthalonitrile, and then added 0.32 g (0.97 m mol) of sodium tungstate (VI) and 9.9 g (88 m mol) of a 30% hydrogen peroxide aqueous solution. The resultant mixture was stirred for 1.5 hour at 65° C. After cooling the reaction mixture to room temperature, the resultant precipitates were separated by a filtration under reduced pressure, and then washed with water and dried. Thereafter, by recrystallization from isopropanol, there was obtained 9.7 g (Yield: 91%) of white powder synthesis intermediate (A-2) (Melting point=70 to 71° C.).

$^1$HNMR (300 MHz, $CDCl_3$) δ=8.34 (d, 1H), 8.26 (dd, 1H), 8.05 (d, 1H), 3.14 (t, 2H), 1.78-1.67 (m, 2H), 1.42-1.20 (m, 10H), 0.87 (t, 3H)

Synthesis of Exemplified Compounds (P-1-1), (P-2-1), and (P-3-1)

Under nitrogen atmosphere, in 50 ml of 1-methyl-2-pyrrolidone, were dissolved 3.0 g (15 mmol) of tetrafluorophthalonitrile, 1.5 g (5.0 mmol) of synthesis intermediate (B), and 0.99 g (10 mmol) of copper chloride (I), and then stirred for 3 hours at 180° C. After cooling the reaction mixture to room temperature, it was poured into 200 ml of a 5% hydrochloric acid. Consequently, blue crystals were precipitated. These crystals were separated by a filtration under reduced pressure, followed by washing with water and then acetonitrile, and thereafter drying. Further, they were boiled with 50 ml of acetonitrile for 1 hour, and allowed to cool down to room temperature. The resultant precipitates were separated by a filtration under reduced pressure, and then dried. Thereby was obtained 2.2 g (Yield: 45%) of a mixture (PP-1) (Melting point>200° C.) containing the exemplified compounds (P-1-1), (P-2-1), and (P-3-1) of the present invention; and hexadecafluoro cupper phthalocyanine ($F_{16}$CuPc).

A mixing rate of phthalocyanine derivatives was measured by a liquid chromatography mass spectrometric analysis (LCMS). The result in terms of area ratio was as follows: (P-1-1):(P-2-1):(P-3-1):($F_{16}$CuPc)=54.0:26.4:4.1:15.5 (Since a molar absorption intensity of each of (P-1-1), (P-2-1), (P-3-1), and ($F_{16}$CuPc) at a detecting wavelength of 254 nm is almost same, the ratio measured from the area results in equal to a molar ratio.).

Measuring conditions: TSK gel ODS-80Ts (2 mm Φ×150 mm), elute: a mixed solution of A/B (volume ratio 3:7) from 0 minute to 15 minutes, and a mixed solution of A/B (volume ratio 15:85) from 15 minutes to 20 minutes (elute A: water, elute B: a mixed solution of tetrahydrofuran/methanol (volume ratio 9:1)), flow rate: 0.2 ml/min, a detecting wavelength 254 nm, structural determination by atmospheric pressure chemical ionization (APCI)-mass spectrometry (MS) (It was confirmed using MS that a peak at the retention time=8.185 minutes was ($F_{16}$CuPc), a peak at the retention time=11.676 minutes was (P-1-1), a peak at the retention time=13.905 minutes was (P-2-1), and a peak at the retention time=14.350 minutes was (P-3-1)). A peak was detected in the blank at the retention time of from 0 to 4 minutes, so that a measurement was started from 4 minutes.

Figure 3:
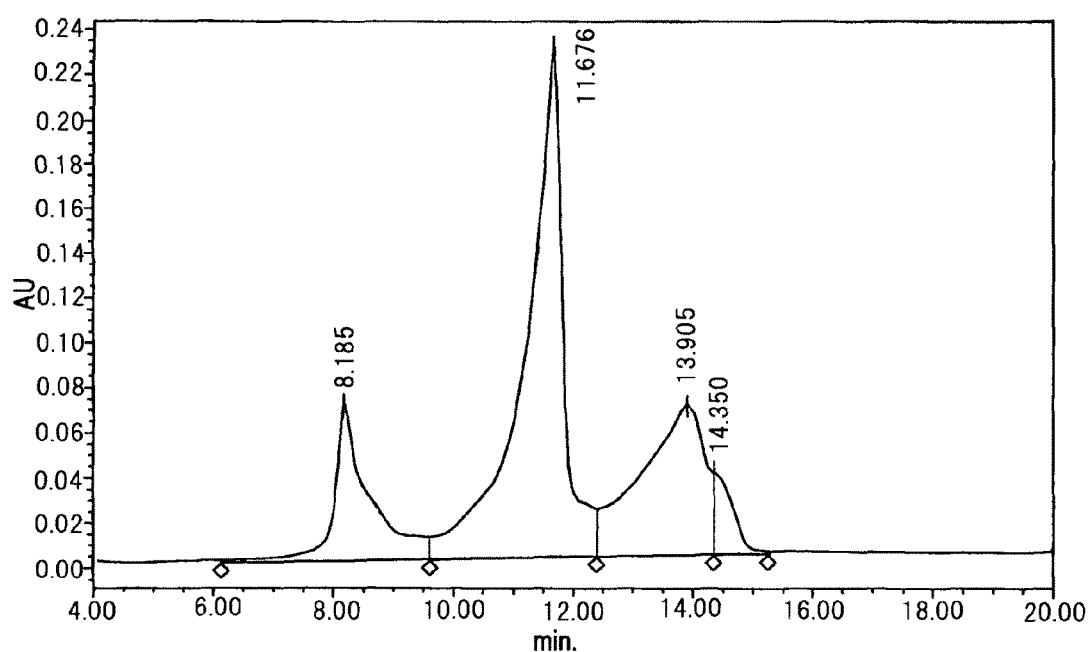
FIG. 3 is a chart showing a result of liquid chromatography measurement of a mixture of exemplified compounds (P-1-1), (P-2-1), and (P-3-1) of the present invention.
Figure 4:
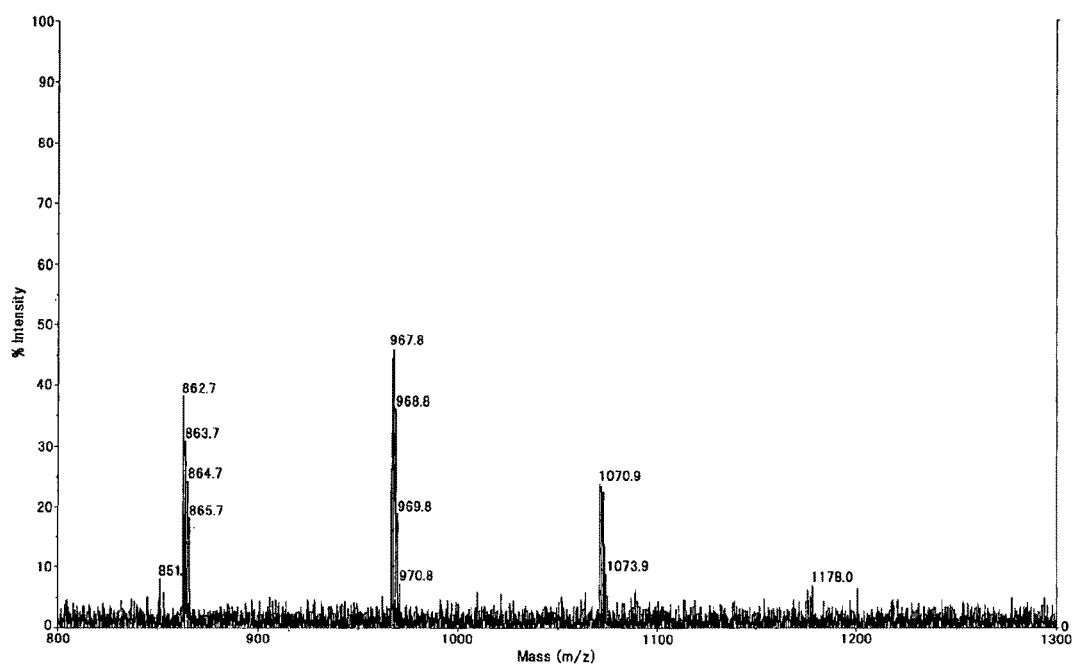
FIG. 4 is a chart showing a result of mass spectrum measurement of a mixture of exemplified compounds (P-1-1), (P-2-1), and (P-3-1) of the present invention.
Figure 5:
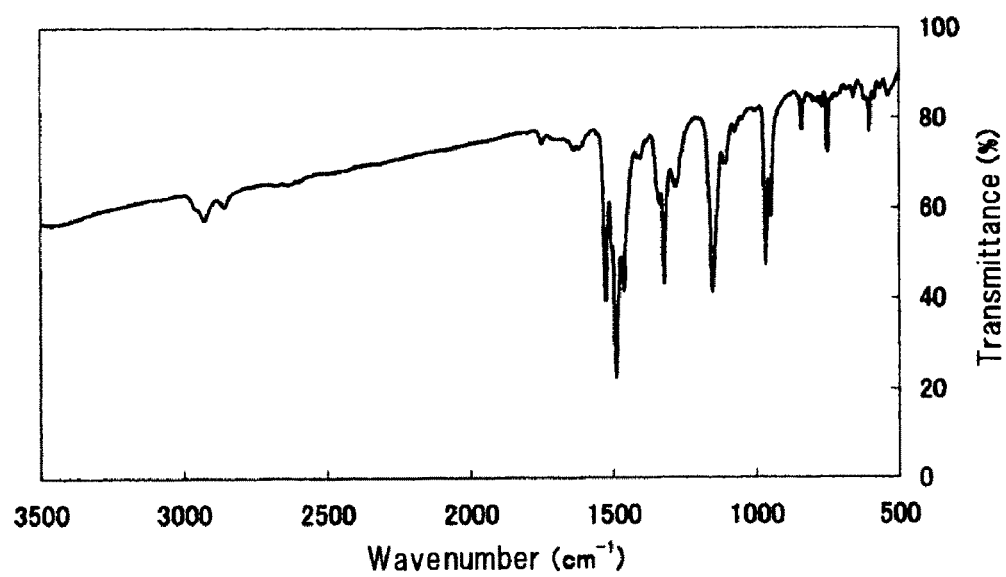
FIG. 5 is a chart showing a result of infrared spectroscopy of a mixture of exemplified compounds (P-1-1), (P-2-1), and (P-3-1) of the present invention.
Figure 6:
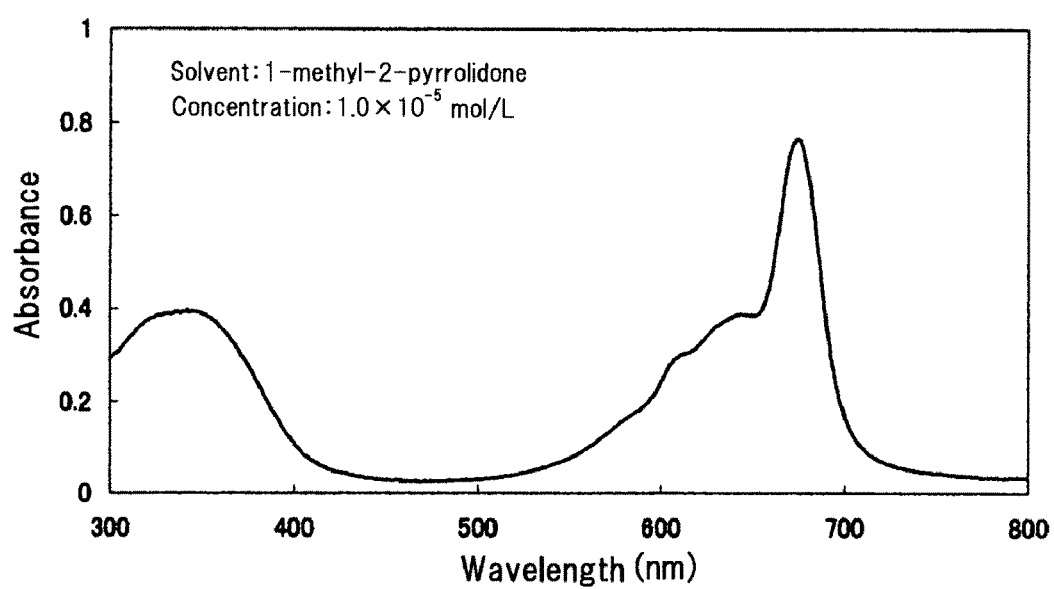
FIG. 6 is a chart showing a result of electronic absorption spectrum measurement ($\lambda_{max}$=674 nm, $\epsilon$=7.58×10$^4$) of a mixture of exemplified compounds (P-1-1), (P-2-1), and (P-3-1) of the present invention.

Hereinafter, there are shown a liquid chromatography chart (Table 1, FIG. 3), a mass spectrum chart (FIG. 4) (measurement by matrix assisted laser desorption ionization (MALDI)-time of flight type (TOF)-mass spectrometer (MS)), an IR chart (FIG. 5), and a chart of electronic (absorption) spectrum (FIG. 6), of the mixture (PP-1) containing the compounds of the present invention.

TABLE 1

| | Name | Analysis channel | Remaining period | Area (μV sec.) | % Area (μV sec.) | Height (μV) |
|---|---|---|---|---|---|---|
| 1 | $F_{16}$CuPc | PDA 254.0 nm | 8.185 | 2887578 | 15.54 | 685327 |
| 2 | P-1-1 | PDA 254.0 nm | 11.676 | 10024811 | 53.96 | 226729 |
| 3 | P-2-1 | PDA 254.0 nm | 13.905 | 4899972 | 26.38 | 65766 |
| 4 | P-3-1 | PDA 254.0 nm | 14.350 | 764657 | 4.12 | 336177 |

(1-2) Electronic Spectrum and Field-Effect Transistor (FET) Characteristics of Mixture (PP-1):

5 mg of the mixture (PP-1) was dissolved in a mixed solvent of 1,2-dichlorobenzene (1 ml)/N,N-dimethylacetamide (1 ml). The resultant solution was cast on a glass substrate that were heated at 80° C. by a hot plate to obtain a thin film sample having a uniform thickness of 1 mm or less for measurement of electronic spectrum.

Figure 7:
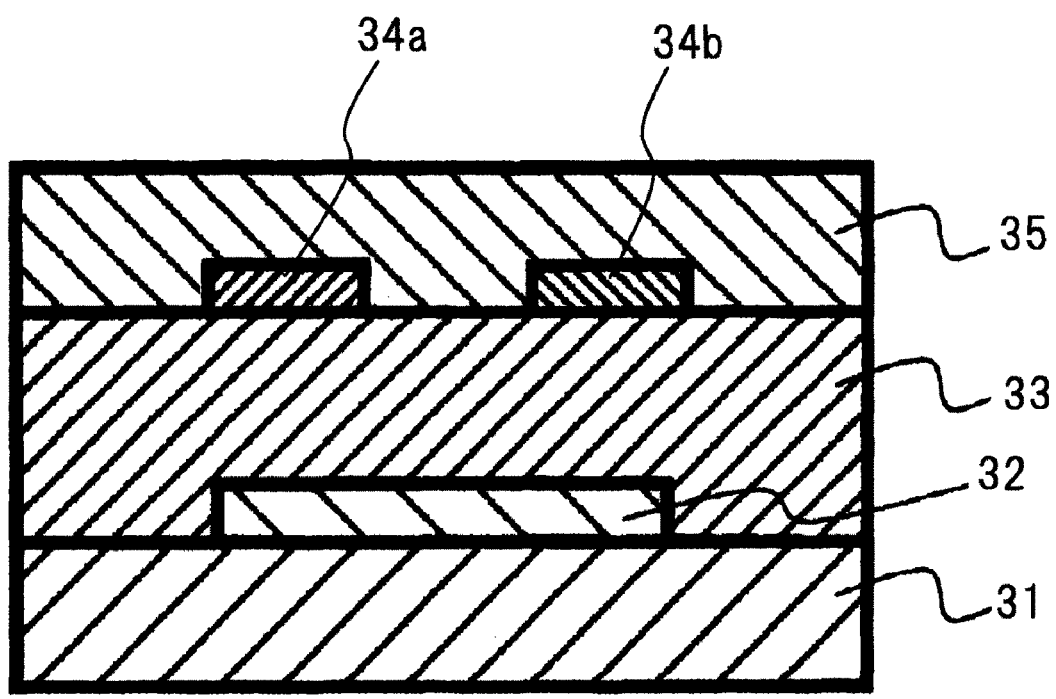
FIG. 7 is a sectional view of schematically illustrating a substrate sample for measuring characteristics of a field-effect transistor (FET).

The solution was also cast to be a substrate sample for measurement of field-effect transistor (FET) characteristics that were heated at 80° C. in the same way as the above to obtain a thin film sample having a uniform thickness of 1 mm or less for measurement of FET characteristics. As the substrate sample for measurement of FET characteristics, a substance sample shown in FIG. 7 was used. Specifically, there was used a substrate sample having a bottom contact structure provided with gold electrodes 32, 34a, and 34b (gate width: 100000 μm, gate length: 100 μm); a $SiO_2$ insulating coat 33 (thickness 100 nm); an organic semiconductor layer 35; and a substrate 31.

The reflection electronic spectrum was measured using a visible-violet spectrophotometer (trade name, a product of Shimadzu, MPC-2200/UV-2400). The FET characteristics was measured using a semiconductor parameter analyzer (trade name, a product of Agilent, 4156C) connected to a semiautoprober (trade name, a product of Vector Semiconductor, AX-2000) under a normal pressure/air atmosphere, under a normal pressure/nitrogen atmosphere (in a globe box).

Figure 8:
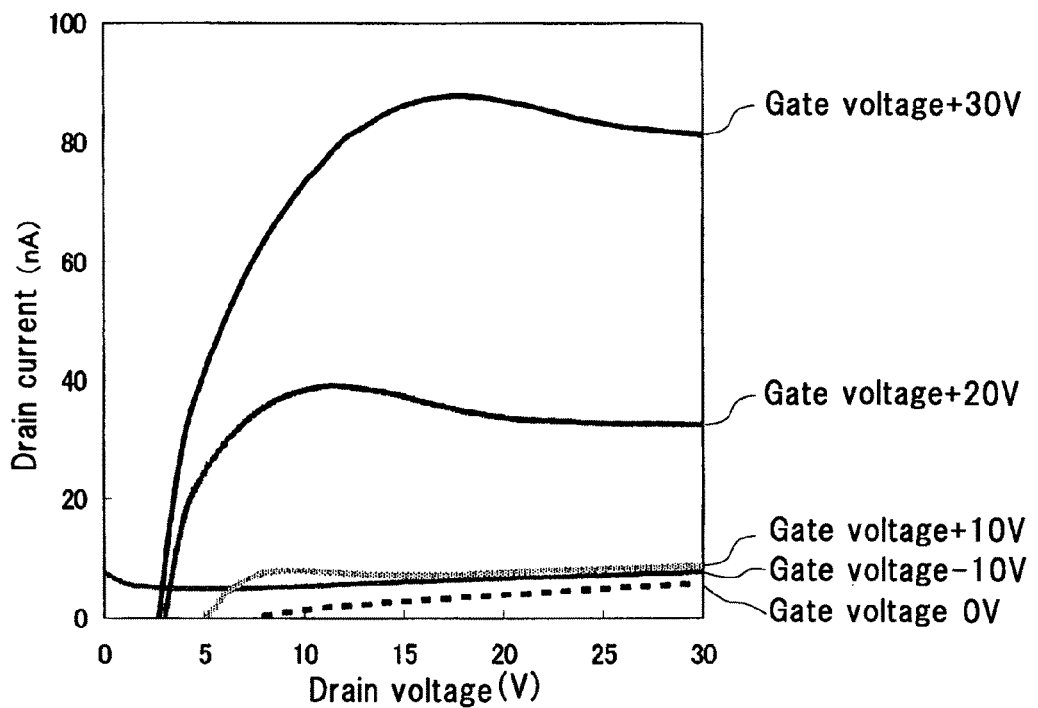
FIG. 8 (A) and FIG. 8 (B) are charts showing voltage/current characteristics of a mixture of exemplified compounds (P-1-1), (P-2-1), and (P-3-1) of the present invention.
Figure 8:
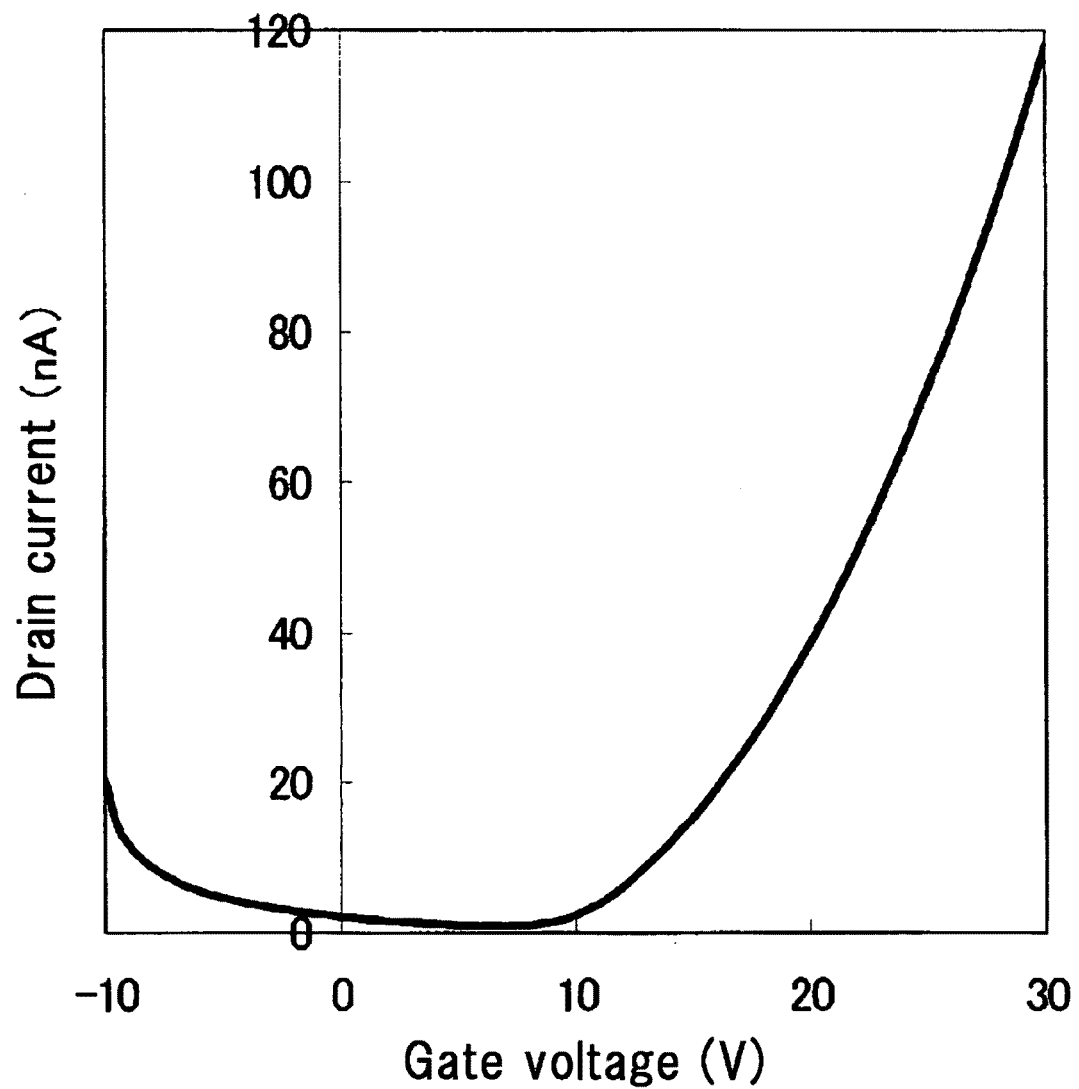
Figure 10A:
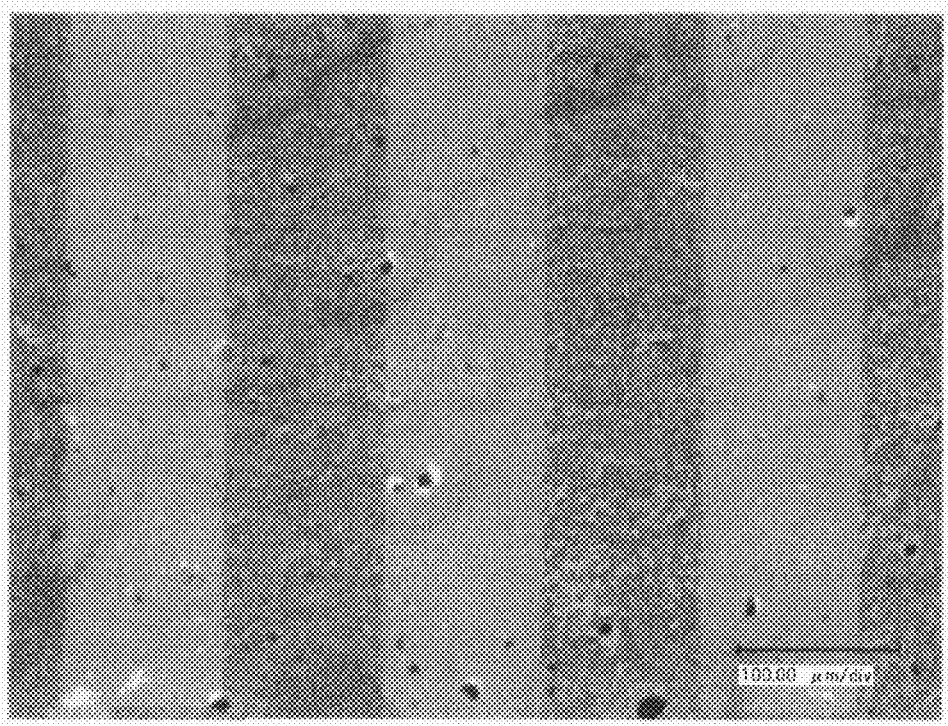
FIG. 10 (A) and FIG. 10 (B) are images obtained by microscopic observation.
Figure 10B:

FIG. 8 shows FET characteristics (drain voltage/drain current characteristics) measured in the air. The mixture (PP-1) containing the compound of the present invention showed favorable characteristics as an n-type semiconductor. The carrier mobility μ was calculated by the formula expressing drain current $I_d$: $I_d=(w/2L)\mu C_i(V_g-V_{th})^2$, wherein L is gate length, W is gate width, $C_i$ is capacity of the insulator layer per unit area, $V_g$ is gate voltage, and $V_{th}$ is threshold voltage. The on/off ratio was calculated from the ratio between the maximum and minimum drain current values ($I_d$). The mobility of the mixture (PP-1) containing the compound of the present invention in the air was $\mu=1.2\times10^{-5}$ cm$^2$ Vs, and the on/off ratio was 130 during operation at a drain voltage of +10 V and a gate voltage of +30 V. Observation of the FET device under an optical microscope showed an above-described uniform organic thin film formed by the device of the present invention (FIG. 10(A)). Warp stripes in FIGS. 10 (A) and (B) show a source electrode and a drain electrode (the same as in FIG. 14).

Figure 11:
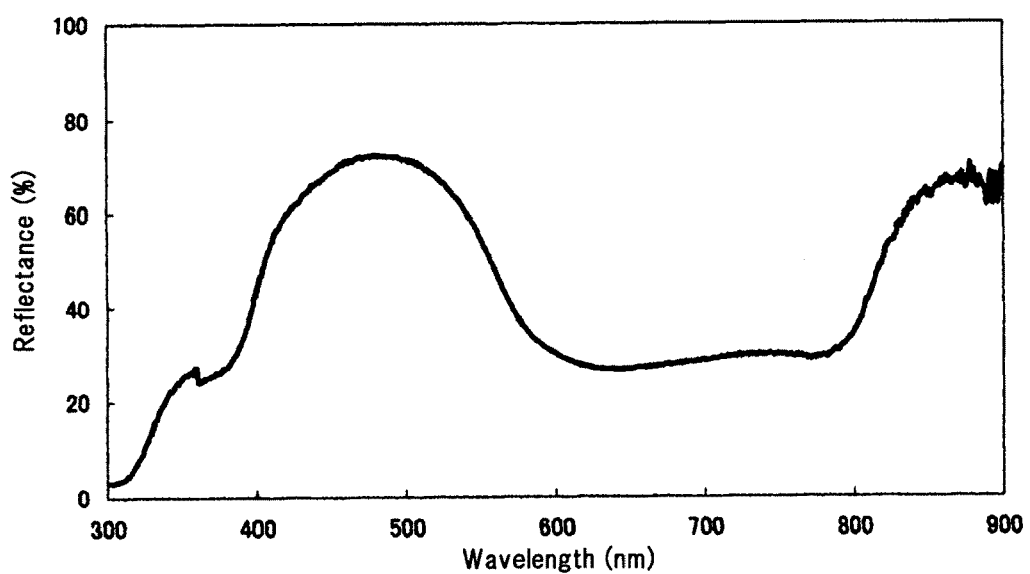
FIG. 11 is a chart showing a result of reflection electronic spectrum measurement of a mixture of exemplified compounds of the present invention.

FIG. 11 shows the electronic spectrum of the thin film of the mixture (PP-1) containing the compound of the present invention measured in reflection a glass substrate. From the spectrum, there were observed absorption at a neighbor of 680 nm originated from absorption of a monomer having a phthalocyanine structure, and also a long wave absorption in the near infrared region (700 to 800 nm) originated from a formation of associates. Such the result suggests an excellent molecular association property of the compound according to the present invention. It is assumed from the above that such the excellent molecular association property contributes to the development of high electronic functions such as excellent FET characteristics.

Figure 12:
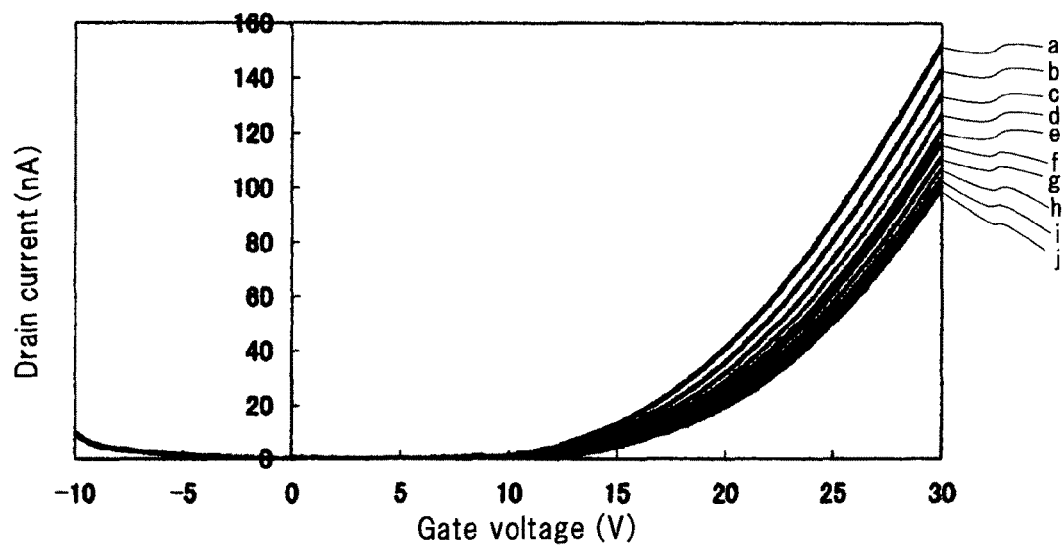
FIG. 12 is a chart showing results of photoelectric conversion spectrum measurements of a mixture of exemplified compounds of the present invention.

In FIG. 12, curves a to j show repeated characteristics of gate voltage/drain current characteristics under atmosphere (drain voltage=+10V) obtained by measuring ten times repeatedly at drain voltage=+10V, using the above-described substrate sample as to the present invention which was used in measurement of FET characteristics. In FIG. 12, a to j show the results of first to tenth measurement. For the compound of the present invention, mobility decreased as the number of measurement increased. However, even though the test was repeated ten times, 19% was still remaining as the mobility being $9.7\times10^{-6}$ cm$^2$/Vs. From the result, it is recognized that the compound of the present invention is excellent in stability of repeating operation under atmosphere.

Further, the FET characteristics were measured in a nitrogen atmosphere; the carrier mobility determined from the saturated region was $u=1.5\times10^{-4}$ cm$^2$/Vs, and the on/off ratio was 540 during operation at a drain voltage of +10 V and a gate voltage of +100 V.

(1-3) Photoelectric Conversion Characteristics of Device Using Mixture (PP-1)

A glass substrate having thereon a patterned ITO electrode (100 nm) was subjected to an ultrasonic cleaning in isopropyl alcohol, and then dried. Further, UV ozone treatment was performed to remove organic staining materials on the surface of ITO electrode. Subsequently, on the ITO substrate, was coated PEDOT (3,4-ethylenedioxythiophene)/PSS (polystylenesulfonic acid) aqueous solution (trade name, Baytron P (standard good)) by spin coat (4000 rpm, 30 seconds) to form the thin film having film thickness of about 50 nm.

After drying the coating at 120° C. for 1 hour, were dissolved P3HT (poly(3-hexylthiophene), regioregular, the upper limit of Mw is about 87000, a product of Aldrich) (0.5% by mass) as a p-type semiconductor and a mixture (PP-1) (0.5% by mass) containing the compound of the present invention as a n-type semiconductor in a mixed solvent of 1,2-dicyclobenzene/N,N-dimethylacetamide (1:1). The resultant solution was coated by spin coat (1000 rpm, 60 seconds) to form an organic photoelectric conversion layer having the thickness from 20 to 30. On the thus obtained organic thin coating layer of a uniform mixed coating, LiF and Al were vacuum-deposited in this order so that thickness of LiF and Al became 1 nm and 80 nm respectively, thereby to form a metal electrode. The resultant coating material was transferred to a globe box while keeping vacuum conditions, and then sealed under nitrogen atmosphere using a seal can and a UV cured resin to obtain a photoelectric conversion film (device) having an effective area of 0.04 cm$^2$. Thus obtained product was designated as sample (PV-1). Photoelectric conversion properties was measured by irradiating a white light (0.05 m W/cm$^2$) of a xenon lamp (trade name, a product of Hamamatsu photonics, L 2195) as a light source in an irradiation range of 1.5 mm in diameter from the ITO electrode side of the photoelectric conversion film using a spectral sensitivity measuring equipment (trade name, a product of Sumitomo Heavy Industries Advanced Machinery) installed with a source meter (trade name, a product of Keithley Company, 6430).

Figure 15:
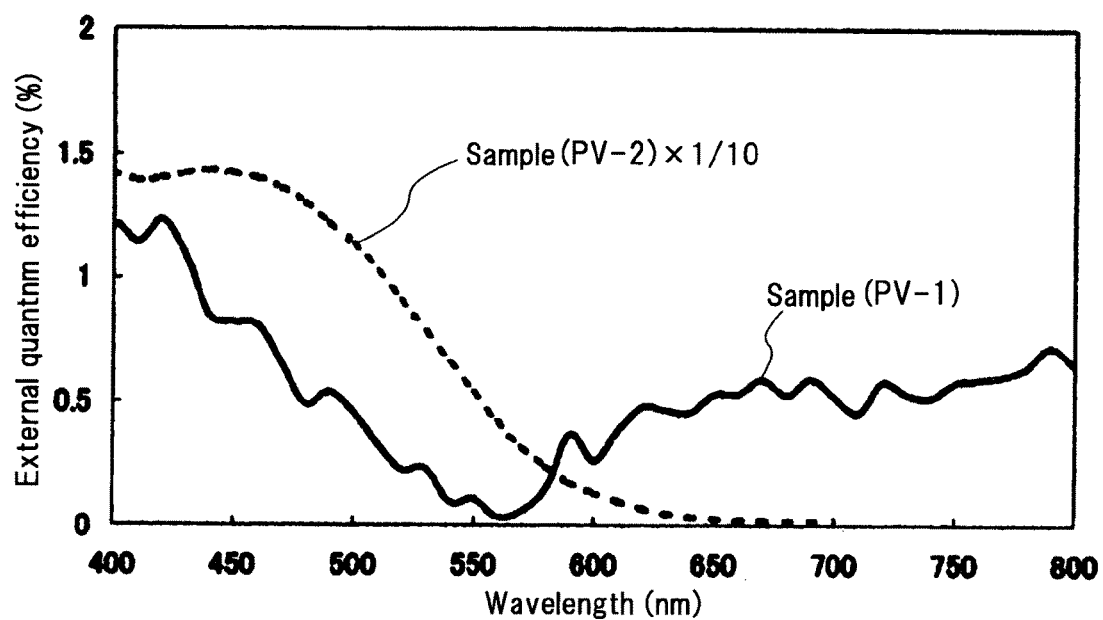
FIG. 15 is a chart showing results of photoelectric conversion spectrum measurements of a sample (PV-1) of the present invention, and a sample (PV-2) for comparison.

FIG. 15 shows photoelectric conversion spectra of the sample (PV-1) obtained by the above-described methods. The result of the measurement indicated that the mixture (PP-1) containing exemplified compounds of the present invention exhibited photoelectric conversion characteristics over a wide wavelength range from the visible range to the near-infrared range.

Comparative Example 1

Figure 9:
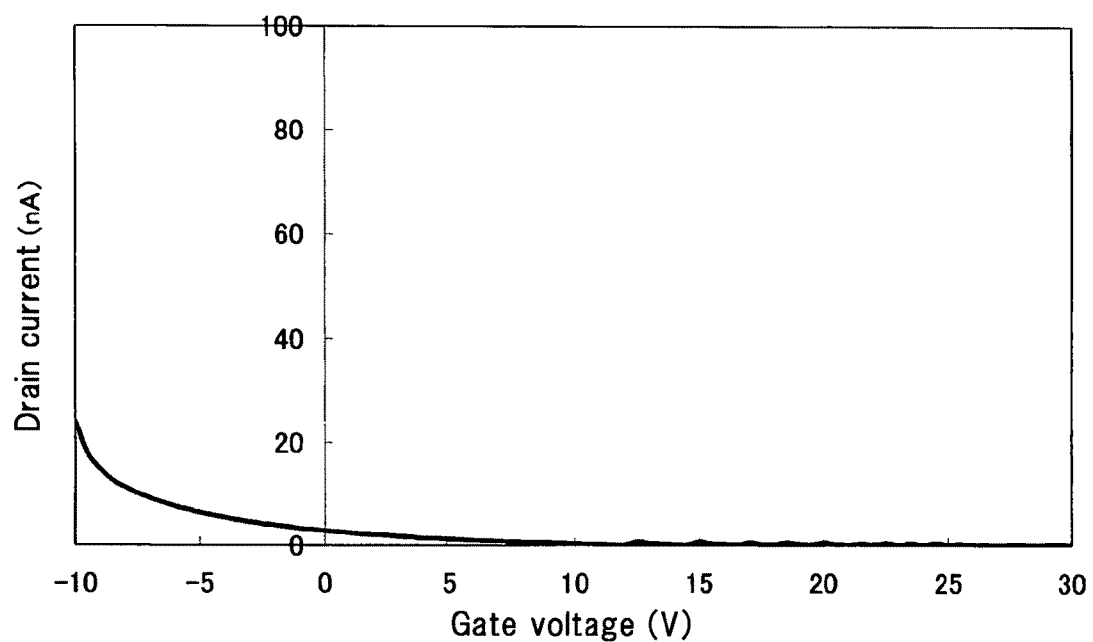
FIG. 9 is a chart showing gate voltage/drain current characteristics of a field-effect transistor (FET) of the comparison sample ($F_{16}$CuPc).

An FET device was made in the same manner as (Example 1-2), except that $F_{16}$CuPc (purchased from Aldrich and purified by sublimation) was used in place of the mixture (PP-1) containing the compound of the present invention, and measured for its FET characteristics under the same measurement conditions; no FET characteristic was exhibited both under the air and a nitrogen atmosphere (FIG. 9). Observation of the device used for the measurement under an optical microscope indicated that the coating of $F_{16}$CuPc formed no thin film because of its low solubility and high crystallinity (FIG. 10(B)).

Comparative Example 2

Figure 13:
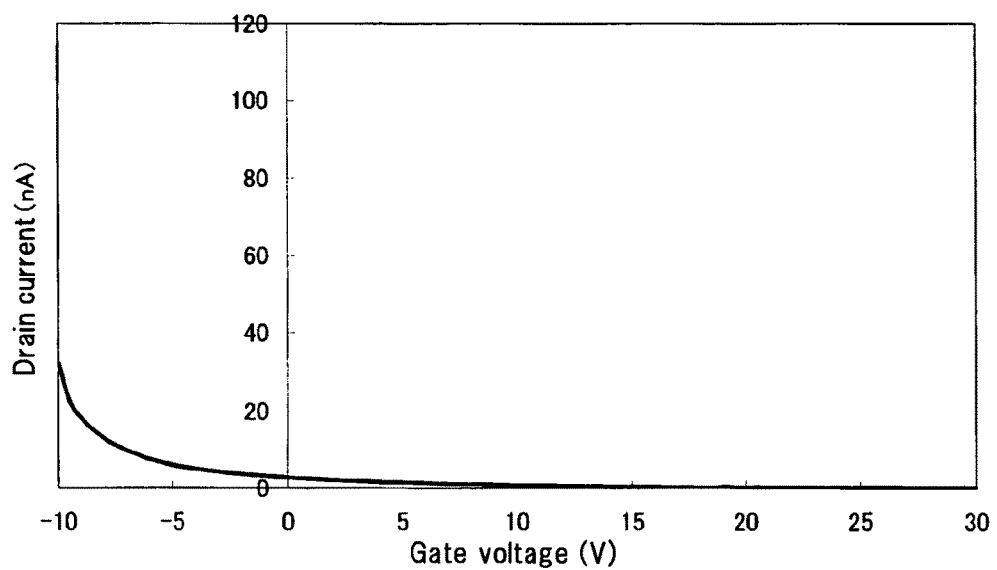
FIG. 13 is a chart showing a result obtained by measuring FET characteristics using PCBM of comparison n-type semiconductor.
Figure 14:
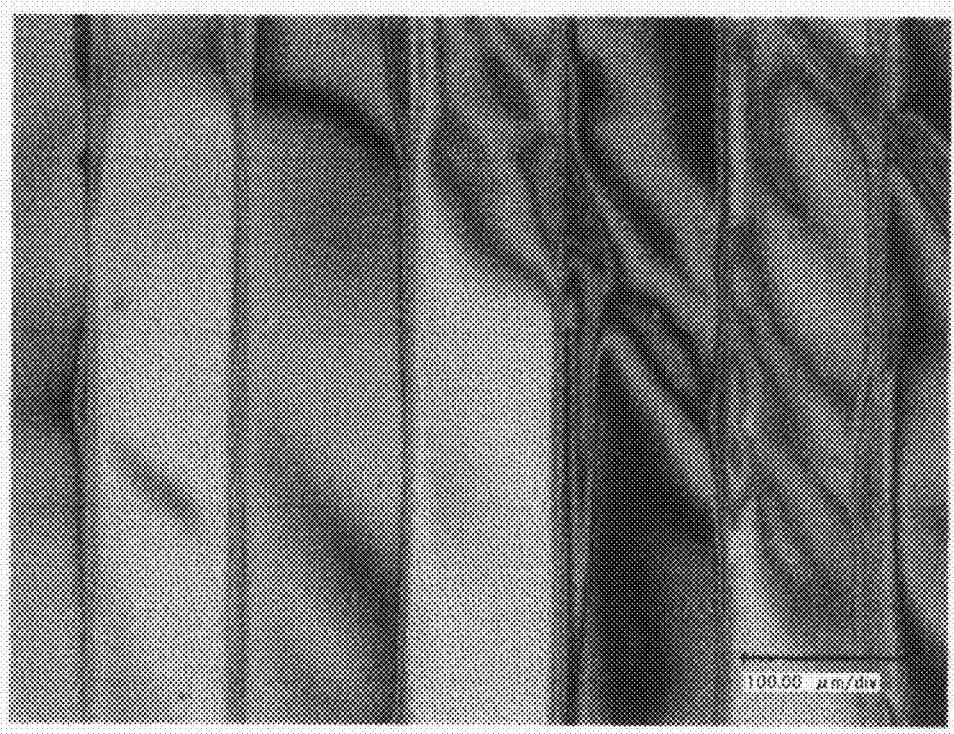
FIG. 14 is an image obtained by microscopic observation of a thin film containing a comparison compound.

An FET device was made in the same manner as (Example 1 (1-2)), except that PCBM ([6,6]-phenyl-C61-butyric acid methyl ester), an n-type organic semiconductor capable of forming a thin film through a wet film forming process, was used in place of the mixture (PP-1) containing the compound of the present invention, and measured for its FET characteristics in the air; no FET characteristic was exhibited (FIG. 13). Observation of the device used for the measurement under an optical microscope showed the formation of a non-crystallized thin film having a thickness of 1 mm or less (FIG. 14). The reason that no FET characteristic was exhibited is considered that the operation stability of PCBM was so low in the air that the characteristic was deteriorated in the air.

Comparative Example 3

As a comparative sample (PV-2), a photoelectric conversion device was made in the same manner as (Example 1 (1-3)), except that PCBM was used as the n-type organic semiconductor in place of the mixture (PP-1) containing the compound of the present invention, and 1,2-dichlorobenzene was used as the solvent in place of the mixed solvent of 1,2-dichlorobenzene/N,N-dimethylacetamide (1:1). FIG. 15 shows a photoelectric conversion spectrum of PV-2, which indicates that the mixture (PP-1) containing exemplified compounds of the present invention significantly improved the photoelectric conversion properties in the long wavelength region in comparison with PCBM.

Example 2

Exemplified Compounds (P-1-2), (P-2-2), and (P-3-2)

A mixture (PP-2) of compounds (P-1-2), (P-2-2), and (P-3-2) of the present invention, and $F_{16}CuPc$ was obtained in a yield of 50% in the same manner as (Example 1 (1-1)), except that 4-(1H, 1H, 2H, 2H-perfluorooctyl) sulfonyl phthalonitrile, which had been synthesized in the same manner as the synthesis intermediate (A-2), was used in place of the synthesis intermediate (A-2). A melting point of the mixture (PP-2) was over 200° C. The mixture ratio of the phthalocyanine derivatives determined by LCMS was (P-1-2):(P-2-2):(P-3-2):($F_{16}CuPc$)=33:47:0:20 in terms of the area ratio.

Figure 16:
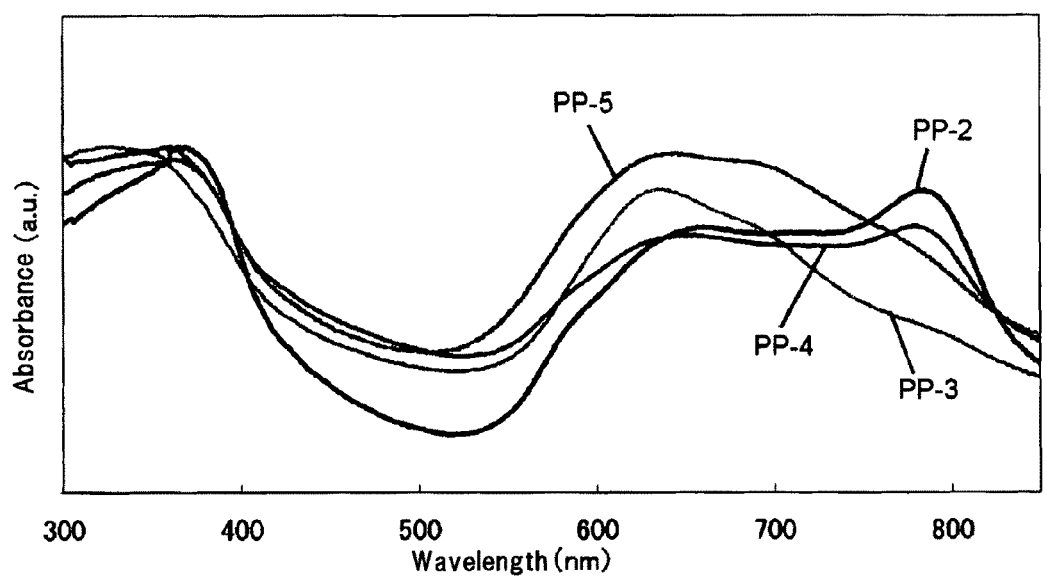
FIG. 16 is a chart showing results of electron spectrum measurements of mixtures of exemplified compounds of the present invention.

An FET device was made in the same manner as (Example 1 (1-2)) using the mixture (PP-2) containing the compound of the present invention, and measured for its FET characteristics under nitrogen atmosphere; $\mu=2.0\times10^{-5}$ cm$^2$/Vs, and the on/off ratio was 4600 during operation at a drain voltage of +10 V and a gate voltage of +100 V. The electronic spectrum of the thin film measured in the same manner as (Example 1 (1-2)), except that a quartz substrate was used as a substrate in place of a glass substrate and measured not in reflection but in absorption showed a long wave absorption extending to the near-infrared region (700 to 800 nm) as shown in FIG. 16.

Example 3

Exemplified Compounds (P-1-3), (P-2-3), and (P-3-3)

A mixture (PP-3) of the compounds (P-1-3), (P-2-3), and (P-3-3) of the present invention and $F_{16}CuPc$ was obtained in a yield of 76% in the same manner as (Example 1-1), except that 4-t-tetradecylsulfonyl phthalonitrile, which had been synthesized in the same manner as the synthetic intermediate (A-2), was used in place of the synthetic intermediate (A-2). A melting point of the mixture (PP-3) was over 200° C. The mixture ratio of the phthalocyanine derivatives determined by LCMS was (P-1-3):(P-2-3):(P-3-3):($F_{16}CuPc$)=46:13:0:41 in terms of the area ratio.

An FET device was made in the same manner as (Example 1 (1-2)) using the mixture (PP-3) containing the compound of the present invention, and measured for its FET characteristics under nitrogen atmosphere; $\mu=2.2\times10^{-6}$ cm$^2$/Vs, and the on/off ratio was 34 during operation at a drain voltage of +10 V and a gate voltage of +100 V. The electronic spectrum of the thin film measured in the same manner as (Example 1-2) showed a long wave absorption extending to the near-infrared region (700 to 800 nm) as shown in FIG. 16.

Example 4

Exemplified Compounds (P-1-3), (P-2-3), and (P-3-3)

A mixture (PP-4) of the compounds (P-1-4), (P-2-4), and (P-3-4) of the present invention and $F_{16}CuPc$ was obtained in a yield of 43% in the same manner as (Example 1 (1-1)), except that 4-(2-ethylhexyl)sulfonyl phthalonitrile, which had been synthesized in the same manner as the synthetic intermediate (A-2), was used in place of the synthetic intermediate (A-2). A melting point of the mixture (PP-4) was over 200° C. The mixture ratio of the phthalocyanine derivatives determined by LCMS was (P-1-4):(P-2-4):(P-3-4):($F_{16}CuPc$)=46:30:6:18 in terms of the area ratio.

An FET device was made in the same manner as (Example 1 (1-2)) using the mixture (PP-4) containing the compound of the present invention, and measured for its FET characteristics under nitrogen atmosphere; $\mu=9.5\times10^{-7}$ cm$^2$/Vs, and the on/off ratio was 15 during operation at a drain voltage of +10 V and a gate voltage of +100 V. The electronic spectrum of the thin film measured in the same manner as (Example 1-2) showed a long wave absorption extending to the near-infrared region (700 to 800 nm) as shown in FIG. 16.

Example 5

Exemplified Compounds (P-4-1), (P-5-1), and (P-6-1)

A mixture (PP-5) of the exemplified compounds (P-4-1), (P-5-1), and (P-6-1) of the present invention and $F_{16}CuPc$ was obtained in a yield of 52% in the same manner as (Example 1-1), except that 3-n-octylsulfonyl phthalonitrile, which had been synthesized in the same manner as the synthetic intermediate (A-2), was used in place of the synthetic intermediate (A-2). A melting point of the mixture (PP-5) was over 200° C. The mixture ratio of the phthalocyanine derivatives determined by LCMS was (P-4-1): (P-5-1): (P-6-1): ($F_{16}CuPc$)=61:23:0:16 in terms of the area ratio.

An FET device was made in the same manner as (Example 1 (1-2)) using the mixture (PP-5) containing the compound of the present invention, and measured for its FET characteristics in a nitrogen atmosphere; $\mu=1.9\times10^{-6}$ cm$^2$ Vs, and the on/off ratio was 180 during operation at a drain voltage of +10 V and a gate voltage of +100 V. The electronic spectrum of the thin film measured in the same manner as (Example 1 (1-2)) showed a long wave absorption extending to the near-infrared region (700 to 800 nm) as shown in FIG. 16.

Example 6

The resultant FET characteristics and on/off ratio of each FET device, which was made respectively using the mixtures (PP-1 to PP-5) containing exemplified compounds of the present invention, were measured. Results are shown in Table 2 below.

TABLE 2

| Mixture | Characteristic | Mobility $\mu$(cm$^2$/Vs) | on/off ratio |
| --- | --- | --- | --- |
| PP-1 | n-type | $1.5 \times 10^{-4}$ | 540 |
| PP-2 | n-type | $2.0 \times 10^{-5}$ | 4600 |
| PP-3 | n-type | $2.2 \times 10^{-6}$ | 34 |
| PP-4 | n-type | $9.5 \times 10^{-7}$ | 15 |
| PP-5 | n-type | $1.9 \times 10^{-6}$ | 1800 |

Having described our invention as related to the present embodiments, it is our intention that the invention not be limited by any of the details of the description, unless otherwise specified, but rather be construed broadly within its spirit and scope as set out in the accompanying claims.

This non-provisional application claims priority under 35 U.S.C. §119 (a) on Patent Application No. 2006-077768 filed in Japan on Mar. 20, 2006, and Patent Application No. 2007-039295 filed in Japan on Feb. 20, 2007, which are incorporated by reference.

What we claim is:

1. An organic semiconductor comprising at least one compound represented by formula (PC-2):

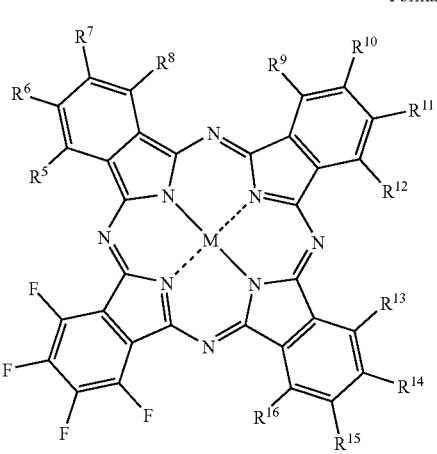

Formula (PC-2)

wherein M represents a metallic atom or two hydrogen atoms, the two hydrogen atoms bond respectively to a nitrogen atom of an isoindole ring and to a nitrogen atom of an isoindoline ring when M represents two hydrogen atoms, and the metal atom represented by M is selected from the group consisting of Li, Na, K, Be, Mg, Ca, Ba, Al, Si, Hg, Cr, Fe, Co, Ni, Cu, Zn, Ge, Pd, Cd, Sn, Pt, Pb, Sr, V, Mn, Ti, In or Ga; $R^5$, $R^6$, $R^7$, $R^8$, $R^9$, $R^{10}$, $R^{11}$, $R^{12}$, $R^{13}$, $R^{14}$, $R^{15}$, and $R^{16}$ each independently represents a hydrogen atom or a substituent selected from the group consisting of a fluorine atom, an alkyl group, an aryl group, $-SO_2R^{17}$ and $-SO_2N(R^{17})_2$ with the proviso that at least the one substituent is $-SO_2R^{17}$ or $-SO_2N(R^{17})_2$, and $R^{17}$ represents a hydrogen atom, an alkyl group, an aryl group, or a heterocyclic group.

2. The organic semiconductor according to claim 1, wherein the compound represented by formula (PC-2) is a compound represented by formula (PC-3):

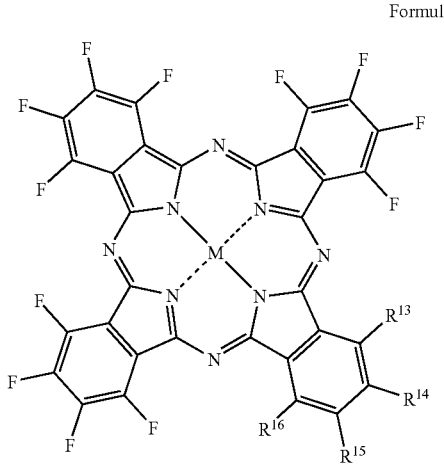

Formula (PC-3)

wherein, M represents a metallic atom or two hydrogen atoms, the two hydrogen atoms bond respectively to a nitrogen atom of an isoindole ring and to a nitrogen atom of an isoindoline ring when M represents two hydrogen atoms, and the metal atom represented by M is selected from the group consisting of Li, Na, K, Be, Mg, Ca, Ba, Al, Si, Hg, Cr, Fe, Co, Ni, Cu, Zn, Ge, Pd, Cd, Sn, Pt, Pb, Sr, V, Mn, Ti, In or Ga; $R^{13}$, $R^{14}$, $R^{15}$, and $R^{16}$ each independently represents a hydrogen atom or a substituent selected from the group consisting of a fluorine atom, an alkyl group, an aryl group, $-SO_2R^{17}$ and $-SO_2N(R^{17})_2$ with the proviso that at least the one substituent is $-SO_2R^{17}$ or $-SO_2N(R^{17})_2$, and $R^{17}$ represents a hydrogen atom, an alkyl group, an aryl group, or a heterocyclic group.

3. A thin film organic semiconductor comprising a compound represented by formula (PC-2):

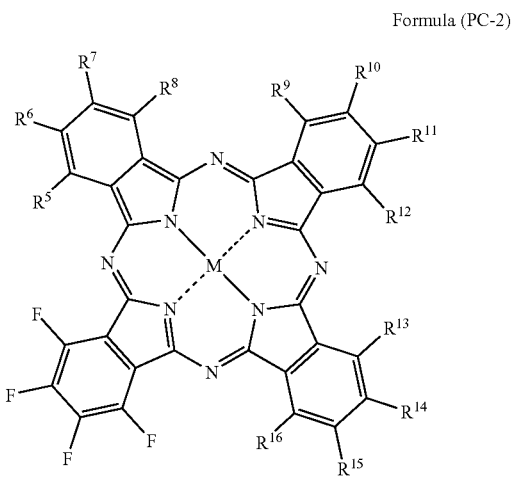

Formula (PC-2)

wherein M represents a metallic atom or two hydrogen atoms, the two hydrogen atoms bond respectively to a nitrogen atom of an isoindole ring and to a nitrogen atom of an isoindoline ring when M represents two hydrogen atoms, and the metal atom represented by M is selected from the group consisting of Li, Na, K, Be, Mg, Ca, Ba, Al, Si, Hg, Cr, Fe, Co, Ni, Cu, Zn, Ge, Pd, Cd, Sn, Pt, Pb, Sr, V, Mn, Ti, In or Ga; $R^5$, $R^6$, $R^7$, $R^8$, $R^9$, $R^{10}$, $R^{11}$, $R^{12}$, $R^{13}$, $R^{14}$, $R^{15}$, and $R^{16}$ each independently represents a hydrogen atom or a substituent selected from the group consisting of a fluorine atom, an alkyl group, an aryl group, $-SO_2R^{17}$ and $-SO_2N(R^{17})_2$ with the proviso that at least the one substituent is $-SO_2R^{17}$ or $-SO_2N(R^{17})_2$, and $R^{17}$ represents a hydrogen atom, an alkyl group, an aryl group, or a heterocyclic group.

4. A thin film organic semiconductor comprising a compound represented by formula (PC-3):

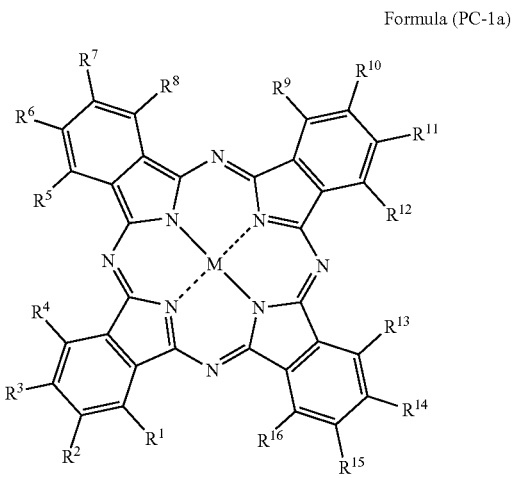

Formula (PC-1a)

wherein, M represents a metallic atom or two hydrogen atoms, the two hydrogen atoms bond respectively to a nitrogen atom of an isoindole ring and to a nitrogen atom of an isoindoline ring when M represents two hydrogen atoms, and the metal atom represented by M is selected from the group consisting of Li, Na, K, Be, Mg, Ca, Ba, Al, Si, Hg, Cr, Fe, Co, Ni, Cu, Zn, Ge, Pd, Cd, Sn, Pt, Pb, Sr, V, Mn, Ti, In or Ga; $R^{13}$, $R^{14}$, $R^{15}$, and $R^{16}$ each independently represents a hydrogen atom or a substituent selected from the group consisting of a fluorine atom, an alkyl group, an aryl group, —$SO_2R^{17}$ and —$SO_2N(R^{17})_2$ with the proviso that at least the one substituent is —$SO_2R^{17}$ or —$SO_2N(R^{17})_2$, and $R^{17}$ represents a hydrogen atom, an alkyl group, an aryl group, or a heterocyclic group.

\* \* \* \* \*